United States Patent
Oak

(10) Patent No.: US 11,201,616 B2
(45) Date of Patent: Dec. 14, 2021

(54) VOLTAGE TOLERANT INTERFACE CIRCUIT

(71) Applicant: Empower Semiconductor, Fremont, CA (US)

(72) Inventor: Parag Oak, Sunnyvale, CA (US)

(73) Assignee: EMPOWER SEMICONDUCTOR, INC., Milpitas, CA (US)

( * ) Notice: Subject to any disclaimer, the term of this patent is extended or adjusted under 35 U.S.C. 154(b) by 0 days.

(21) Appl. No.: 17/081,888

(22) Filed: Oct. 27, 2020

(65) Prior Publication Data

US 2021/0044289 A1 Feb. 11, 2021

Related U.S. Application Data

(63) Continuation of application No. 16/148,232, filed on Oct. 1, 2018, now Pat. No. 10,879,889.

(51) Int. Cl.
*H03K 17/082* (2006.01)
*H03K 5/24* (2006.01)

(52) U.S. Cl.
CPC .......... *H03K 17/0822* (2013.01); *H03K 5/24* (2013.01)

(58) Field of Classification Search
CPC ............. H03K 17/082; H03K 17/0822; H03K 17/08126; H03K 5/24; H03K 5/2409; H03K 5/2472
See application file for complete search history.

(56) References Cited

U.S. PATENT DOCUMENTS

| 7,564,317 | B2 * | 7/2009 | Ker | H03B 5/36 326/80 |
| 9,588,529 | B2 * | 3/2017 | Balteanu | G05F 1/56 |
| 10,748,769 | B2 | 9/2020 | Lidsky et al. | |
| 10,879,889 | B2 * | 12/2020 | Oak | H03K 5/24 |

* cited by examiner

*Primary Examiner* — Adolf D Berhane
(74) *Attorney, Agent, or Firm* — Farjami & Farjami LLP

(57) ABSTRACT

A voltage tolerant interface circuit includes an input terminal and one or more low-voltage transistors for generating an output from the voltage tolerant interface circuit based on a voltage received at the input terminal. The voltage tolerant interface circuit also includes a blocking transistor coupled between a control terminal of at least one low-voltage transistor and the input terminal. In some implementations, the blocking transistor is configured to protect the control terminal of the low-voltage transistor by blocking the voltage received at the input terminal when the voltage exceeds a voltage tolerance of the low-voltage transistor. In other implementations, the low-voltage transistor receives a supply voltage higher than the voltage tolerance of the low-voltage transistor. In that implementation, the blocking transistor is configured to protect the control terminal of the low-voltage transistor by blocking the voltage received at the input terminal when the voltage is below a predetermined threshold.

18 Claims, 9 Drawing Sheets

VOLTAGE TOLERANT INTERFACE CIRCUIT

This is a continuation of application Ser. No. 16/148,232 filed on Oct. 1, 2018. The above-identified application is hereby incorporated fully by reference into the present application.

BACKGROUND

Low-voltage transistors can be advantageous for a wide variety of electronics applications due to their high speed, low power consumption, and small size. Despite their potential advantages, however, the use of low-voltage transistors may be limited by their susceptibility to damage or failure when exposed to the high voltages present in many applications.

One common application where high voltages are typically present is DC-DC voltage regulation. Nevertheless, high bandwidth, high accuracy, DC-DC voltage regulators require high speed circuits that low-voltage transistors are well suited to implement. For example, a DC-DC voltage regulator may require a high speed comparator to sample an operating characteristic of a power transistor when it is turned on. While the power transistor is turned on, the voltages encountered in measuring its operation are typically safe for low-voltage transistors to be exposed to. However, when the power transistor is turned off, it may be at a voltage that substantially exceeds such a safe voltage level. Consequently, there is a need in the art for a solution enabling use of low-voltage transistors in applications in which voltages exceeding their voltage tolerance may be present.

SUMMARY

The present disclosure is directed to voltage tolerant circuits and systems, substantially as shown in and/or described in connection with at least one of the figures, and as set forth in the claims.

DETAILED DESCRIPTION

Figure 1:
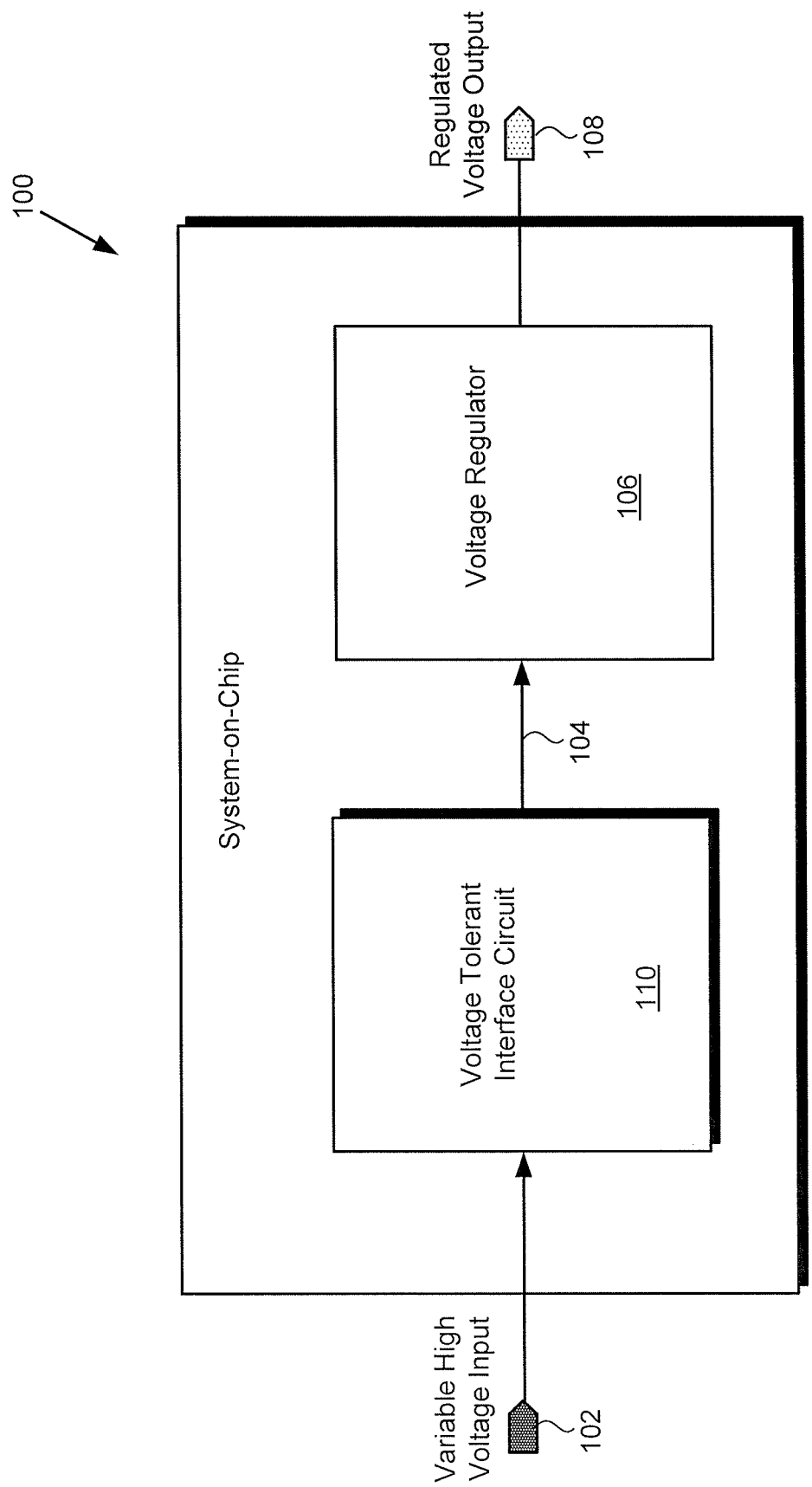
FIG. 1 shows a diagram of an exemplary system-on-chip (SoC) including an integrated voltage regulator and voltage tolerant interface circuit, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, low-voltage transistors can be advantageous for a wide variety of electronics applications due to their high speed, low power consumption, and small size. As further stated above, despite their potential advantages, the use of low-voltage transistors may be limited by their susceptibility to damage or failure when exposed to the high voltages present in many applications, such as DC-DC voltage regulation, for example.

The present application addresses and overcomes the constraints on the use of low-voltage transistors by disclosing a solution enabling use of low-voltage transistors in applications in which voltages exceeding their voltage tolerance may be present. By interposing a blocking transistor between a control terminal of a low-voltage transistor and an input terminal to a voltage tolerant interface circuit in which it is implemented, the present inventive principles provide voltage protection for the low-voltage transistor.

In some implementations, the blocking transistor protects the control terminal of the low-voltage transistor by blocking the voltage received at the input terminal when the voltage exceeds a voltage tolerance of the low-voltage transistor. In other implementations, the low-voltage transistor receives a supply voltage higher than its voltage tolerance. In that implementation, the blocking transistor protects the control terminal of the low-voltage transistor by blocking the voltage received at the input terminal when the voltage is below a predetermined threshold.

It is noted that, as defined for the purposes of the present application, the expression "voltage tolerance" refers to the maximum voltage that a transistor can sustain between any two terminals without being damaged. For example, in the case of a low-voltage field-effect transistor (low-voltage FET), the voltage tolerance of the low-voltage FET is the maximum voltage the FET can sustain between any two of its gate, source, drain, and body terminals. As a specific example, where a low-voltage FET is described as having a voltage tolerance of up to one volt (1.0 V), that FET can tolerate a voltage difference of up to a maximum of 1.0 V between any two of its gate, source, drain, and body terminals without being damaged.

FIG. 1 shows a diagram of exemplary system-on-chip (SoC) 100 including integrated voltage regulator 106 and voltage tolerant interface circuit 110, according to one implementation. According to the exemplary implementation shown in FIG. 1, voltage tolerant interface circuit 110 receives an input voltage at input terminal 102 and generates output 104 based on the voltage received at input terminal 102. As further shown in FIG. 1, output 104 is provided to integrated voltage regulator 106, which processes output 104 as part of providing a regulated voltage at regulated voltage output 108 of SoC 100.

Integrated voltage regulator 106 may be a high bandwidth, highly accurate "on chip" DC-DC voltage regulator. According to the exemplary implementation shown in FIG. 1, voltage tolerant interface circuit 110 is included on chip with integrated voltage regulator 106 as part of SoC 100. Consequently, it may be advantageous of desirable to implement voltage tolerant interface circuit 110 using low-voltage transistors to enhance its speed, reduce its power consumption, and minimize its size on chip. By way of example, voltage tolerant interface circuit 110 may take the form of a high speed comparator including low-voltage transistors having a voltage tolerance of 1.0 V or less, such as 0.9 V, or even less. In other exemplary implementations, voltage tolerant interface circuit 110 may take the form of an amplifier or level converter, to name merely two alternative examples.

According to the present exemplary implementation, the input voltage received by voltage tolerant interface circuit 110 at input terminal 102 may be variable, and may sometimes exceed, or substantially exceed, the voltage tolerance of the low-voltage transistors utilized in voltage tolerant interface circuit 110. For example, in implementations in which voltage tolerant interface circuit 110 is implemented using low-voltage transistors having a voltage tolerance of 1.0 V or less, the input voltage at input terminal 102 may vary between zero volts (0.0 V) and 1.8 V. As is discussed in greater detail below by reference to FIGS. 2A, 2B, 2C, 3A, 3B, 4A, 4B, and 5, voltage tolerant input circuit 110 includes features providing voltage protection to one or more low-voltage transistors it includes.

Figure 2A:
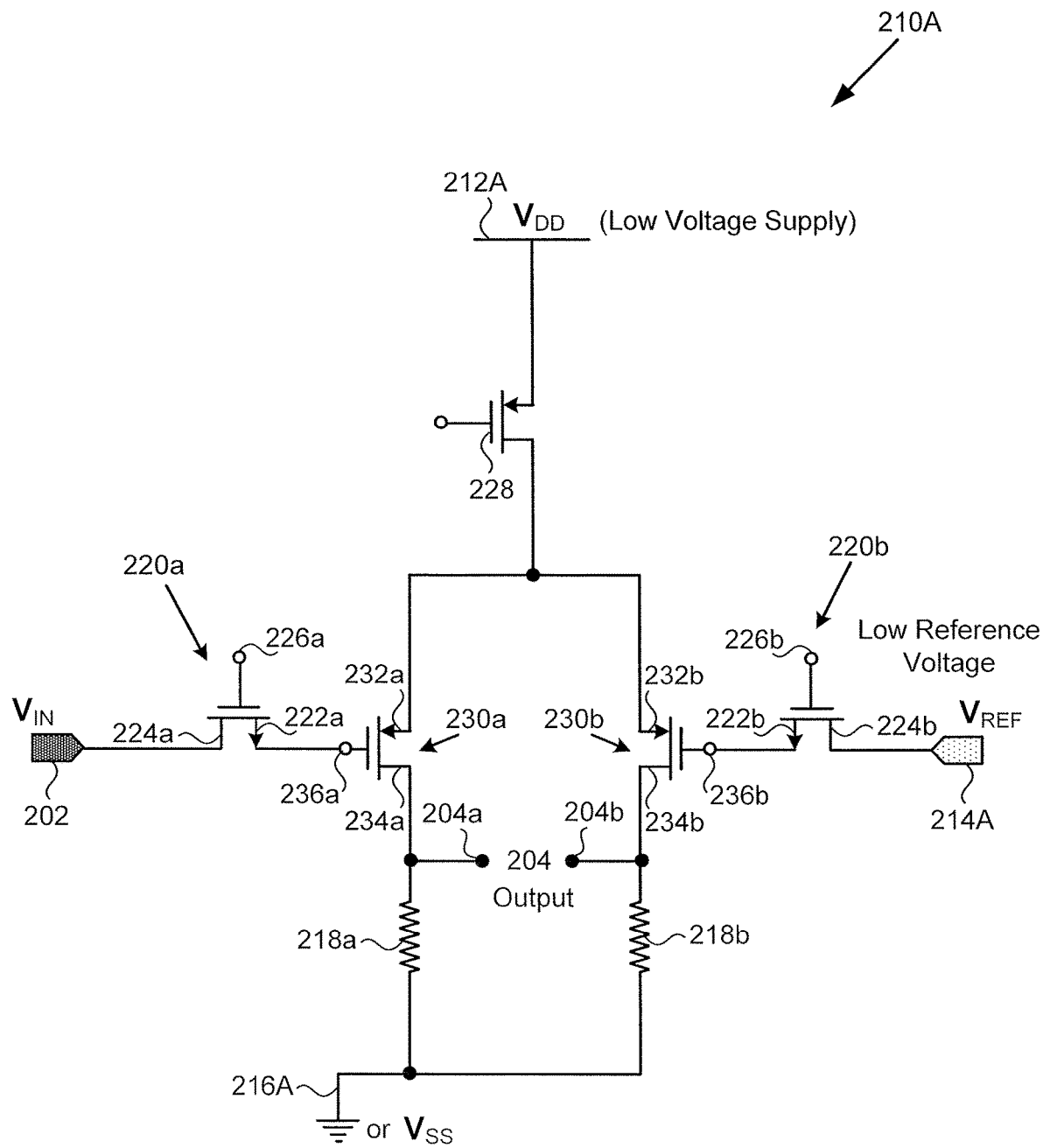
FIG. 2A shows a diagram of an exemplary voltage tolerant interface circuit suitable for use as part of the SoC of FIG. 1, according to one implementation.

FIG. 2A shows a diagram of exemplary voltage tolerant interface circuit 210A suitable for use as part of SoC 100 in FIG. 1, according to one implementation. As shown in FIG. 2A, exemplary voltage tolerant interface circuit 210A is implemented as a differential comparator receiving input voltage ($V_{IN}$) at input terminal 202 and generating output 204 at differential output terminals 204a and 204b based on the voltage $V_{IN}$ received at input terminal 202. Voltage tolerant interface circuit 210A having input terminal 202 and providing output 204 corresponds in general to voltage tolerant interface circuit 110 having input terminal 102 and providing output 104, in FIG. 1. Consequently, voltage tolerant interface circuits 110 and 210A may share features and attributes that are common to both circuits.

In the present exemplary implementation, voltage tolerant interface circuit 210A includes differential pair transistors 230a and 230b, and supply rail transistor 228, each implemented as a low-voltage transistor having a voltage tolerance of up to approximately 1.0 V. In addition, voltage tolerant interface circuit 210A includes first blocking transistor 220a, optional second blocking transistor 220b, low reference voltage input 214A, and load devices 218a and 218b shown as respective load resistors. Also shown in FIG. 2A are low voltage supply ($V_{DD}$) 212A and ground or $V_{SS}$ 216A.

It is noted that although voltage tolerant interface circuit 210A includes differential pair transistors 230a and 230b, supply rail transistor 228, first blocking transistor 220a, and optional second blocking transistor 220b in the form of FETs, that representation is merely exemplary. In other implementations, differential pair transistors 230a and 230b, supply rail transistor 228, first blocking transistor 220a, and optional second blocking transistor 220b may take the form of any switching devices suitable to the purposes of voltage tolerant interface circuit 210A and/or SoC 100.

According to the present exemplary implementation, each of differential pair transistors 230a and 230b, and supply rail transistor 228 is shown as a P type FET (PFET), while each of first blocking transistor 220a and optional second blocking transistor 220b takes the form of an N type FET (NFET). Thus, first blocking transistor 220a has source 222a, drain 224a, and gate 226a, while optional second blocking transistor 220b has source 222b, drain 224b, and gate 226b.

Moreover, differential pair transistor 230a has source 232a, drain 234a, and gate 236a (hereinafter "control terminal 236a"), while differential pair transistor 230b has source 232b, drain 234b, and gate 236b (hereinafter "control terminal 236b").

As shown in FIG. 2A, supply rail transistor 228 is coupled between $V_{DD}$ 212A and sources 232a and 232b of respective differential pair transistors 230a and 230b. As further shown in FIG. 2A, differential output terminal 204a is situated between drain 234a of differential pair transistor 230a and load device 218a, and differential output terminal 204b is situated between drain 234b of differential pair transistor 230b and load device 218b.

Load device 218a couples drain 234a of differential pair transistor 230a to ground or $V_{SS}$ 216A, while load device 218b couples drain 234b of differential pair transistor 230b to ground or $V_{SS}$ 216A. It is noted that although load devices 218a and 218b are resistors having substantially identical resistance in the implementation of FIG. 2A, that representation is merely by way of example. In other implementations, load devices 218a and 218b may take the form of diodes or transistors having substantially similar performance characteristics to one another.

First blocking transistor 220a is coupled between control terminal 236a of low-voltage differential pair transistor 230a and input terminal 202. That is to say, according to the exemplary implementation shown in FIG. 2A, source 222a of NFET first blocking transistor 220a may be directly coupled to control terminal 236a of PFET differential pair transistor 230a. Moreover, drain 224a of first blocking transistor 220a may be directly coupled to input terminal 202.

In some implementations, optional second blocking transistor 220b may be coupled between control terminal 236b of low-voltage differential pair transistor 230b and reference voltage input 214A. For instance, according to the exemplary implementation shown in FIG. 2A, source 222b of NFET second blocking transistor 220b may be directly coupled to control terminal 236b of PFET differential pair transistor 230b. Moreover, drain 224b of second blocking transistor 220b may be directly coupled to reference voltage input 214A. However, in implementations in which optional second blocking transistor 220b is omitted, control terminal 236b of low-voltage differential pair transistor 230b may be directly coupled to reference voltage input 214A. It is noted that inclusion or omission of second blocking transistor 220b in voltage tolerant interface circuit 210A is a matter of design choice.

In operation, voltage tolerant interface circuit 210A compares voltage $V_{IN}$ applied to a terminal, e.g., drain 224a, of first blocking transistor 220a to a reference voltage ($V_{REF}$) applied to reference voltage input 214A. In the interests of conceptual clarity, the functionality of voltage tolerant interface circuit 210A is described below by reference to specific operating parameters. However, it is emphasized that the specific parameter values described herein are merely exemplary and are not to be interpreted as limiting the concepts disclosed by the present application.

As noted above, differential pair transistors 230a and 230b, and supply rail transistor 228, may each be a low-voltage transistor having a voltage tolerance of up to approximately 1.0 V. As further noted above, input voltage $V_{IN}$ at input terminal 102/202 of voltage tolerant interface circuit 110/210A may vary between 0.0 V and 1.8 V. For merely exemplary purposes, low voltage supply $V_{DD}$ 212A may be at 0.9 V, $V_{REF}$ applied to reference voltage input 214A may be in a range between 0.0 V and 0.5 V, such as 0.3 V for example, and load devices 218a and 218b may be considered to be coupled between respective differential output terminals 204a and 204b and ground 216A. Moreover, in one implementation, load devices 218a and 218b may take the form of resistors having substantially identical resistance in a range from approximately five hundred ohms (500Ω) to approximately fifty kilo ohms (50 kΩ).

First blocking transistor 220a and optional second blocking transistor 220b have their respective gates 226a and 226b biased at a voltage between $V_{REF}$ and the voltage tolerance of low-voltage differential pair transistors 230a and 230b. As a result of that biasing, first blocking transistor 220a and optional second blocking transistor 220b are always-on blocking transistors.

Because first blocking transistor 220a and optional second blocking transistor 220b are always-on, their switching speed is not relevant to the overall performance of voltage tolerant interface circuit 210A. Consequently, first blocking transistor 220a and optional second blocking transistor 220b may be implemented using small, fast, low-voltage transistors or using larger, slower, higher voltage tolerant transistors. In one implementation, first blocking transistor 220a and optional second blocking transistor 220b may take the form of low-voltage transistors having a voltage tolerance substantially equal to the voltage tolerance of low-voltage differential pair transistors 230a and 230b, i.e., a voltage tolerance of up to approximately 1.0 V.

As noted above, in some implementations, optional second blocking transistor 220b may be omitted and control terminal 236b of low-voltage differential pair transistor 230b may be directly coupled to reference voltage input 214A. However, in other implementations, optional second blocking transistor 220b may be coupled between control terminal 236b of low-voltage differential pair transistor 230b and reference voltage input 214A, and may have its gate 226b biased higher than $V_{REF}$. As a specific example, where $V_{REF}$ is equal to 0.3 V, gate 226b of second blocking transistor 220b may be biased at 0.6 V.

Whether second blocking transistor 220b is included in voltage tolerant interface circuit 210A or not, a voltage approximately equal to $V_{REF}$ is applied to control terminal 236b of low-voltage differential pair transistor 230b. Moreover, because, according to the present implementation, low-voltage differential pair transistor 230b is a PFET and its gate-to-source voltage is negative, low-voltage differential pair transistor 230b is on, resulting in current flow through load device 218b and an output voltage at differential output terminal 204b.

First blocking transistor 220a is coupled between control terminal 236a of low-voltage differential pair transistor 230a and input terminal 202, and may have its gate 226a biased higher than $V_{REF}$. Once again as a specific example, where $V_{REF}$ is equal to 0.3 V, gate 226a of first blocking transistor 220a may be biased at 0.6 V. In that biased state, first blocking transistor 220a will block a portion of $V_{IN}$ when $V_{IN}$ is higher than the biasing voltage applied to gate 226a. In other words, a voltage at source 222a of first blocking transistor 220a will not exceed the biasing voltage applied to gate 226a. As a result, first blocking transistor 220a protects control terminal 236a of low-voltage differential pair transistor 230a by blocking the voltage received at input terminal 202 when $V_{IN}$ exceeds the voltage tolerance of low-voltage differential pair transistor 230a.

Thus, when $V_{IN}$ is higher than the bias voltage applied to gate 226a, the voltage at source 222a of first blocking transistor 220a, and consequently the voltage applied to control terminal 236a of low-voltage differential pair transistor 230a, is clamped at approximately the bias voltage, e.g., 0.6 V. According to the present implementation, because low-voltage differential pair transistor 230a is a PFET and its gate-to-source voltage is negative, low-voltage differential pair transistor 230a is also on, resulting in current flow through load device 218a and an output voltage at differential output terminal 204a.

However, the gate-to-source voltage of low-voltage differential pair transistor 230a is less negative than the gate-to-source voltage of low-voltage differential pair transistor 230b as long as control terminal 236a sees the bias voltage applied to gate 226a of first blocking transistor 220a, resulting in a difference between the voltages present at respective differential output terminals 204a and 204b.

When $V_{IN}$ is below the bias voltage applied to gate 226a of first blocking transistor 220a, first blocking transistor 220a passes $V_{IN}$ to control terminal 236a of low-voltage differential pair transistor 230a. As long as $V_{IN}$ is greater than $V_{REF}$, a differential voltage having a consistent polarity will be present at output 204. However, when $V_{IN}$ drops below $V_{REF}$, the polarity of the differential voltage at output 204 is reversed. Consequently, first blocking transistor 220a advantageously enables use of low-voltage differential transistors 230a and 230b to implement voltage tolerant interface circuit 210A as a differential comparator, while also advantageously protecting low-voltage differential pair transistor 230a from voltages exceeding its voltage tolerance.

Figure 2B:
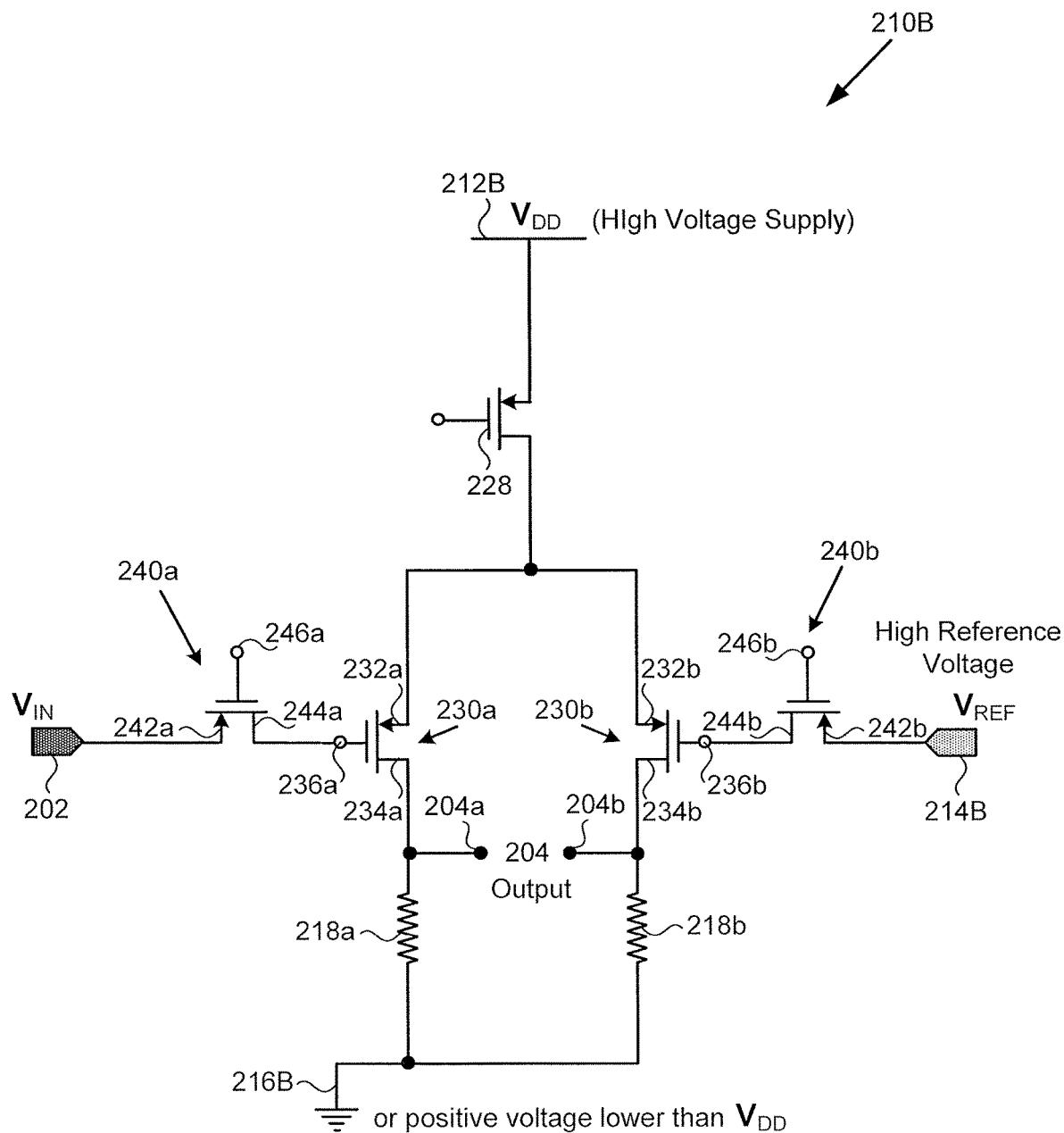
FIG. 2B shows another exemplary implementation of the voltage tolerant interface circuit of FIG. 2A.

Exemplary voltage tolerant interface circuit 210A is configured to compare $V_{IN}$ to $V_{REF}$ when $V_{IN}$ is at the low end of its variable voltage range, i.e., between approximately 0.0 V and approximately 0.9 V. However, in some applications, it may be advantageous or desirable to utilize a voltage tolerant interface circuit including low-voltage transistors to sample compare $V_{IN}$ to $V_{REF}$ when $V_{IN}$ is higher, i.e., up to approximately 1.8 V. FIG. 2B shows one exemplary implementation of such a voltage tolerant interface circuit.

As shown in FIG. 2B, exemplary voltage tolerant interface circuit 210B is implemented as a differential comparator receiving $V_{IN}$ at input terminal 202 and generating output 204 at differential output terminals 204a and 204b based on $V_{IN}$. Voltage tolerant interface circuit 210B having input terminal 202 and providing output 204 corresponds in general to voltage tolerant interface circuit 110 having input terminal 102 and providing output 104, in FIG. 1. Consequently, voltage tolerant interface circuits 110 and 210B may share any of the features attributed to either of voltage tolerant interface circuits 110 and 210B in the present disclosure.

It is noted that voltage tolerant interface circuit 210B shares many features in common with voltage tolerant interface circuit 210A, in FIG. 2A. It is further noted that any features identified in FIG. 2B by reference numbers identical to those used to identify corresponding features in FIG. 2A may share any of the characteristics attributed to those corresponding features above. Thus differential pair transistors 230a and 230b, supply rail transistor 228, and load devices 218a and 218b may have any of the characteristics described above by reference to FIG. 2A.

In addition to the features common to voltage tolerant interface circuit 210A, voltage tolerant interface circuit 210B includes first blocking transistor 240a and optional second blocking transistor 240b in the form of PFET devices, in contrast to the NFET devices utilized for first blocking transistor 220a and optional second blocking transistor 220b in FIG. 2A. In addition, voltage tolerant interface circuit 210B includes high reference voltage input 214B, high voltage supply $V_{DD}$ 212B and ground or low voltage 216B less than $V_{DD}$.

It is noted that although voltage tolerant interface circuit 210B includes first blocking transistor 240a and optional second blocking transistor 240b in the form of FETs, that representation is merely exemplary. In other implementations, first blocking transistor 240a and optional second blocking transistor 240b may take the form of any switching devices suitable to the purposes of voltage tolerant interface circuit 210B and/or SoC 100.

As discussed above, differential pair transistors 230a and 230b, and supply rail transistor 228, may each be a low-voltage transistor having a voltage tolerance of up to approximately 1.0 V. As further noted above, input voltage $V_{IN}$ at input terminal 102/202 of voltage tolerant interface circuit 110/210A may vary between 0.0 V and 1.8 V. Moreover, according to the exemplary implementation shown in FIG. 2B, high voltage supply $V_{DD}$ 212B may be at 1.8 V. That is to say, low-voltage differential pair transistors 230a and 230b, and supply rail transistor 228, receive supply voltage $V_{DD}$ 212B that may be higher than the voltage tolerance of those low-voltage transistors. In addition, $V_{REF}$ applied to reference voltage input 214B may be in a range between 1.3 V and 1.8 V, such as 1.5 V for example, and load devices 218a and 218b may be considered to be coupled between respective differential output terminals 204a and 204b and low voltage 216B at approximately 0.9 V.

It is noted that although low-voltage differential pair transistors 230a and 230b, and low-voltage supply rail transistor 228, are exposed to supply voltage $V_{DD}$ 212B higher than their voltage tolerance, those devices can operate safely as long as the voltage across any two terminals remains within their voltage tolerance. By setting low voltage 216B so that the voltage difference between $V_{DD}$ 212B and low voltage 216B is within the voltage tolerance of those low-voltage devices, and by ensuring that low values of $V_{IN}$ are blocked from control terminal 236a of low-voltage differential pair transistor 230a, voltage tolerant interface circuit 210B can safely compare $V_{IN}$ between 0.9 V and 1.8 V with $V_{REF}$ in that range. It is further noted that when implemented as FETs, the body terminals of each of low-voltage differential pair transistors 230a and 230b, and low-voltage supply rail transistor 228, may be tied to their respective sources.

As shown in FIG. 2B, first blocking transistor 240a includes source 242a, drain 244a, and gate 246a, while optional second blocking transistor 240b includes source 242b, drain 244b, and gate 246b. As further shown in FIG. 2B, first blocking transistor 240a is coupled between control terminal 236a of low-voltage differential pair transistor 230a and input terminal 202. That is to say, according to the exemplary implementation shown in FIG. 2B, drain 244a of PFET first blocking transistor 240a may be directly coupled to control terminal 236a of PFET differential pair transistor 230a. Moreover, source 242a of first blocking transistor 240a may be directly coupled to input terminal 202.

In some implementations, optional second blocking transistor 240b may be coupled between control terminal 236b of low-voltage differential pair transistor 230b and reference voltage input 214B. For instance, according to the exemplary implementation shown in FIG. 2B, drain 244b of PFET second blocking transistor 240b may be directly coupled to control terminal 236b of PFET differential pair transistor 230b. Moreover, source 242b of second blocking transistor 240b may be directly coupled to reference voltage input 214B. However, in implementations in which optional second blocking transistor 240b is omitted, control terminal 236b of low-voltage differential pair transistor 230b may be directly coupled to reference voltage input 214B. It is noted that inclusion or omission of second blocking transistor 240b in voltage tolerant interface circuit 210B is a matter of design choice.

In operation, voltage tolerant interface circuit 210B compares voltage $V_{IN}$ applied to a terminal, e.g., source 242a, of first blocking transistor 240a to reference voltage $V_{REF}$ applied to reference voltage input 214B. First blocking transistor 240a and optional second blocking transistor 240b have their respective gates 246a and 246b biased at a voltage below $V_{REF}$ and above the difference between high voltage supply $V_{DD}$ 212B and the voltage tolerance of low-voltage differential pair transistors 230a and 230b. As a result of that biasing, first blocking transistor 240a and optional second blocking transistor 240b are always-on blocking transistors.

Because first blocking transistor 240a and optional second blocking transistor 240b are always-on, their switching speed is not relevant to the overall performance of voltage tolerant interface circuit 210B. Consequently, first blocking transistor 240a and optional second blocking transistor 240b may be implemented using small, fast, low-voltage transistors or using larger, slower, higher voltage tolerant transistors. In one implementation, first blocking transistor 240a and optional second blocking transistor 240b may take the form of low-voltage transistors having a voltage tolerance substantially equal to the voltage tolerance of low-voltage differential pair transistors 230a and 230b, i.e., a voltage tolerance of up to approximately 1.0 V.

As noted above, in some implementations, optional second blocking transistor 240b may be omitted and control terminal 236b of low-voltage differential pair transistor 230b may be directly coupled to reference voltage input 214B. However, in other implementations, optional second blocking transistor 240b may be coupled between control terminal 236b of low-voltage differential pair transistor 230b and reference voltage input 214B, and may have its gate 246b biased lower than $V_{REF}$. As a specific example, where $V_{REF}$ is equal to 1.5 V, gate 246b of second blocking transistor 240b may be biased at 1.3 V.

Whether second blocking transistor 240b is included in voltage tolerant interface circuit 210B or not, a voltage approximately equal to $V_{REF}$ is applied to control terminal 246b of low-voltage differential pair transistor 230b. Moreover, because, according to the present implementation, low-voltage differential pair transistor 230b is a PFET and its gate-to-source voltage is negative, low-voltage differential pair transistor 230b is on, resulting in current flow through load device 218b and an output voltage at differential output terminal 204b.

First blocking transistor 240a is coupled between control terminal 236a of low-voltage differential pair transistor 230a and input terminal 202, and may have its gate 246a biased lower than $V_{REF}$. Once again as a specific example, where $V_{REF}$ is equal to 1.5 V, gate or 246a of first blocking transistor 240a may be biased at 1.3V. In that biased state, first blocking transistor 240a will block $V_{IN}$ when $V_{IN}$ is lower than the biasing voltage applied to gate 246a, e.g., 1.3 V. In other words, a voltage at drain 244a of first blocking transistor 240a will not fall significantly below the biasing voltage applied to gate 246a. As a result, first blocking transistor 240a protects control terminal 236a of low-voltage differential pair transistor 230a by blocking $V_{IN}$ received at input terminal 202 when the difference between $V_{DD}$ 212B and $V_{IN}$ exceeds the voltage tolerance of low-voltage differential pair transistor 230a.

Thus, when $V_{IN}$ is lower than the bias voltage applied to gate 246a, the voltage at drain 244a of first blocking transistor 240a, and consequently the voltage applied to control terminal 236a of low-voltage differential pair transistor 230a, will be approximately equal to the bias voltage, e.g., 1.3 V. According to the present implementation, because low-voltage differential pair transistor 230a is a PFET and its gate-to-source voltage is negative, low-voltage differential pair transistor 230a is also on, resulting in current flow through load device 218a and an output voltage at differential output terminal 204a.

However, the gate-to-source voltage of low-voltage differential pair transistor 230a is more negative than the gate-to-source voltage of low-voltage differential pair transistor 230b as long as control terminal 236a sees the bias voltage applied to gate 246a of first blocking transistor 240a, resulting in a difference between the voltages present at respective differential output terminals 204a and 204b.

When $V_{IN}$ is above the bias voltage applied to gate 246a of first blocking transistor 240a, first blocking transistor 240a passes $V_{IN}$ to control terminal 236a of low-voltage differential pair transistor 230a. As long as $V_{IN}$ is less than $V_{REF}$, a differential voltage having a consistent polarity will be present at output 204. However, when $V_{IN}$ exceeds $V_{REF}$, the polarity of the differential voltage at output 204 is reversed. Consequently, first blocking transistor 240a advantageously enables use of low-voltage differential transistors 230a and 230b to implement voltage tolerant interface circuit 210B as a differential comparator, while also advantageously protecting low-voltage differential pair transistor 230a from voltages below a predetermined voltage threshold.

Figure 2C:
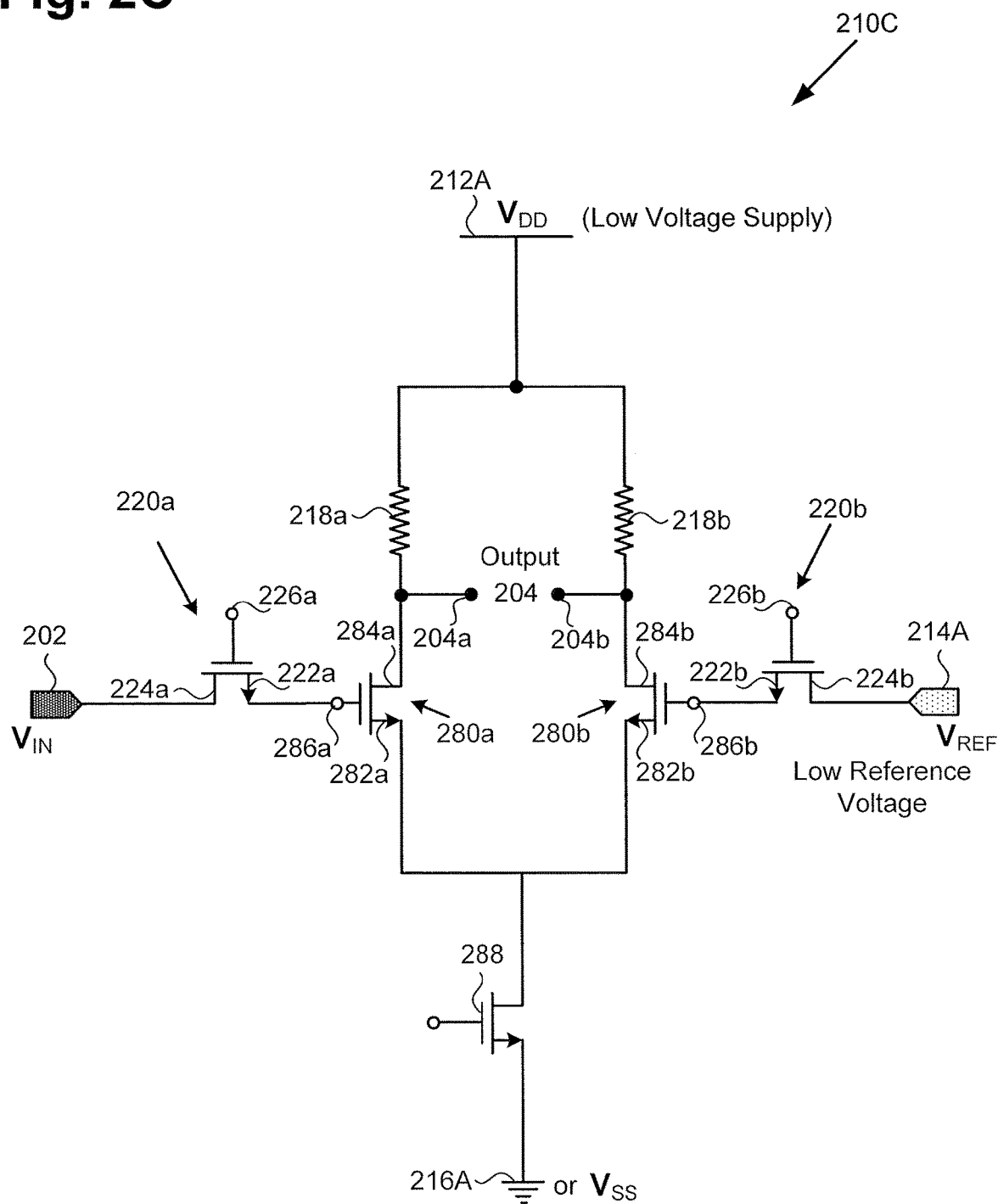
FIG. 2C shows yet another exemplary implementation of the voltage tolerant interface circuit of FIG. 2A.

FIG. 2C shows another exemplary implementation of the voltage tolerant interface circuit of FIG. 2A. As shown in FIG. 2C, exemplary voltage tolerant interface circuit 210C is implemented as a differential comparator receiving $V_{IN}$ at input terminal 202 and generating output 204 at differential output terminals 204a and 204b based on $V_{IN}$. Voltage tolerant interface circuit 210C having input terminal 202 and providing output 204 corresponds in general to voltage tolerant interface circuit 110 having input terminal 102 and providing output 104, in FIG. 1. Consequently, voltage tolerant interface circuits 110 and 210C may share any of the features attributed to either of voltage tolerant interface circuits 110 and 210C in the present disclosure.

It is noted that voltage tolerant interface circuit 210C shares many features in common with voltage tolerant interface circuit 210A, in FIG. 2A. It is further noted that any features identified in FIG. 2C by reference numbers identical to those used to identify corresponding features in FIG. 2A may share any of the characteristics attributed to those corresponding features above. Thus first blocking transistor 220a, optional second blocking transistor 220b, load devices 218a and 218b, low voltage supply $V_{DD}$ 212A and ground or $V_{SS}$ 216A may have any of the characteristics described above by reference to FIG. 2A.

In addition to the features common to voltage tolerant interface circuit 210A, voltage tolerant interface circuit 210B includes differential pair transistors 280a and 280b, and ground rail transistor 288 in the form of NFET devices, in contrast to the PFET devices utilized for differential pair transistors 230a and 230b, and supply rail transistor 228 in FIG. 2A. Differential pair transistors 280a and 280b, and ground rail transistor 288, may each be implemented as a low-voltage transistor having a voltage tolerance of up to approximately 1.0 V.

It is noted that although voltage tolerant interface circuit 210C includes differential pair transistors 280a and 280b, and ground rail transistor 288 in the form of low-voltage FETs, that representation is merely exemplary. In other implementations, differential pair transistors 280a and 280b, and ground rail transistor 288 may take the form of any low-voltage switching devices suitable to the purposes of voltage tolerant interface circuit 210C and/or SoC 100.

According to the present exemplary implementation, each of differential pair transistors 280a and 280b, ground rail transistor 288, first blocking transistor 220a, and optional second blocking transistor 220b takes the form of an NFET. Thus, differential pair transistor 280a has source 282a, drain 284a, and gate 286a (hereinafter "control terminal 286a"), while differential pair transistor 280b has source 282b, drain 284b, and gate 286b (hereinafter "control terminal 286b").

As shown in FIG. 2C, ground rail transistor 288 is coupled between ground or $V_{SS}$ 216A and sources 282a and 282b of respective differential pair transistors 280a and 280b. As further shown in FIG. 2C, differential output terminal 204a is situated to between drain 284a of differential pair transistor 280a and load device 218a, and differential output terminal 204b is situated between drain 284b of differential pair transistor 280b and load device 218b.

Load device 218a couples drain 284a of differential pair transistor 280a to $V_{DD}$ 212A, while load device 218b couples drain 284b of differential pair transistor 280b to $V_{DD}$ 212A. First blocking transistor 220a is coupled between control terminal 286a of low-voltage differential pair transistor 280a and input terminal 202. That is to say, according to the exemplary implementation shown in FIG. 2C, source 222a of NFET first blocking transistor 220a may be directly coupled to control terminal 286a of NFET differential pair transistor 280a. Moreover, drain 224a of first blocking transistor 220a may be directly coupled to input terminal 202.

In some implementations, optional second blocking transistor 220b may be coupled between control terminal 286b of low-voltage differential pair transistor 280b and reference voltage input 214A. For instance, according to the exemplary implementation shown in FIG. 2C, source 222b of NFET second blocking transistor 220b may be directly coupled to control terminal 286b of NFET differential pair transistor 280b. Moreover, drain 224b of second blocking transistor 220b may be directly coupled to reference voltage input 214A. However, in implementations in which optional second blocking transistor 220b is omitted, control terminal 286b of low-voltage differential pair transistor 280b may be directly coupled to reference voltage input 214A. It is noted that inclusion or omission of second blocking transistor 220b in voltage tolerant interface circuit 210C is a matter of design choice.

In operation, voltage tolerant interface circuit 210C compares voltage $V_{IN}$ applied to a terminal, e.g., drain 224a, of first blocking transistor 220a to reference voltage $V_{REF}$ applied to reference voltage input 214A. In the interests of conceptual clarity, the functionality of voltage tolerant interface circuit 210C is described below by reference to specific operating parameters. However, it is emphasized that the specific parameter values described herein are merely exemplary and are not to be interpreted as limiting the concepts disclosed by the present application.

As noted above, differential pair transistors 280a and 280b, and ground rail transistor 288, may each be a low-voltage transistor having a voltage tolerance of up to approximately 1.0 V. As further noted above, input voltage $V_{IN}$ at input terminal 102/202 of voltage tolerant interface circuit 110/210A may vary between 0.0 V and 1.8 V. For merely exemplary purposes, low voltage supply $V_{DD}$ 212A may be at 0.9 V, $V_{REF}$ applied to reference voltage input 214A may be in a range between 0.0 V and 0.5 V, such as 0.3 V for example, and ground rail transistor 288 may be considered to be coupled between differential pair transistors 280a and 280b and ground 216A.

First blocking transistor 220a and optional second blocking transistor 220b have their respective gates 226a and 226b biased at a voltage between $V_{REF}$ and the voltage tolerance of low-voltage differential pair transistors 280a and 280b. As a result of that biasing, first blocking transistor 220a and optional second blocking transistor 220b are always-on blocking transistors.

As noted above by reference to FIG. 2A, because first blocking transistor 220a and optional second blocking transistor 220b are always-on, their switching speed is not relevant to the overall performance of voltage tolerant interface circuit 210A. Consequently, first blocking transistor 220a and optional second blocking transistor 220b may be implemented using small, fast, low-voltage transistors or using larger, slower, higher voltage tolerant transistors. In one implementation, first blocking transistor 220a and optional second blocking transistor 220b may take the form of low-voltage transistors having a voltage tolerance substantially equal to the voltage tolerance of low-voltage differential pair transistors 280a and 280b, i.e., a voltage tolerance of up to approximately 1.0 V.

Whether second blocking transistor 220b is included in voltage tolerant interface circuit 210C or not, a voltage approximately equal to $V_{REF}$ is applied to control terminal 286b of low-voltage differential pair transistor 280b. Moreover, because, according to the present implementation, low-voltage differential pair transistor 280b is an NFET and its gate-to-source voltage is positive, low-voltage differential pair transistor 280b is on, resulting in current flow through load device 218b and an output voltage at differential output terminal 204b.

First blocking transistor 220a is coupled between control terminal 286a of low-voltage differential pair transistor 280a and input terminal 202, and may have its gate 226a biased higher than $V_{REF}$. Once again as a specific example, where $V_{REF}$ is equal to 0.3 V, gate 226a of first blocking transistor 220a may be biased at 0.6 V. In that biased state, first blocking transistor 220a will block a portion of $V_{IN}$ when $V_{IN}$ is higher than the biasing voltage applied to gate 226a. In other words, a voltage at source 222a of first blocking transistor 220a will not exceed the biasing voltage applied to gate 226a. As a result, first blocking transistor 220a protects control terminal 286a of low-voltage differential pair transistor 280a by blocking the voltage received at input terminal 202 when $V_{IN}$ exceeds the voltage tolerance of low-voltage differential pair transistor 280a.

Thus, when $V_{IN}$ is higher than the bias voltage applied to gate 226a, the voltage at source 222a of first blocking transistor 220a, and consequently the voltage applied to control terminal 286a of low-voltage differential pair transistor 280a, is clamped at approximately the bias voltage, e.g., 0.6 V. According to the present implementation, because low-voltage differential pair transistor 280a is an NFET and its gate-to-source voltage is positive, low-voltage differential pair transistor 280a is also on, resulting in current flow through load device 218a and an output voltage at differential output terminal 204a.

However, the gate-to-source voltage of low-voltage differential pair transistor 280b is less positive than the gate-to-source voltage of low-voltage differential pair transistor 280a as long as control terminal 286a sees the bias voltage applied to gate 226a of first blocking transistor 220a, resulting in a difference between the voltages present at respective differential output terminals 204a and 204b.

When $V_{IN}$ is below the bias voltage applied to gate 226a of first blocking transistor 220a, first blocking transistor 220a passes $V_{IN}$ to control terminal 286a of low-voltage differential pair transistor 280a. As long as $V_{IN}$ is greater than $V_{REF}$, a differential voltage having a consistent polarity will be present at output 204. However, when $V_{IN}$ drops below $V_{REF}$, the polarity of the differential voltage at output 204 is reversed. Consequently, first blocking transistor 220a advantageously enables use of low-voltage differential transistors 280a and 280b to implement voltage tolerant interface circuit 210C as a differential comparator, while also advantageously protecting low-voltage differential pair transistor 280a from voltages exceeding its voltage tolerance.

Figure 3A:
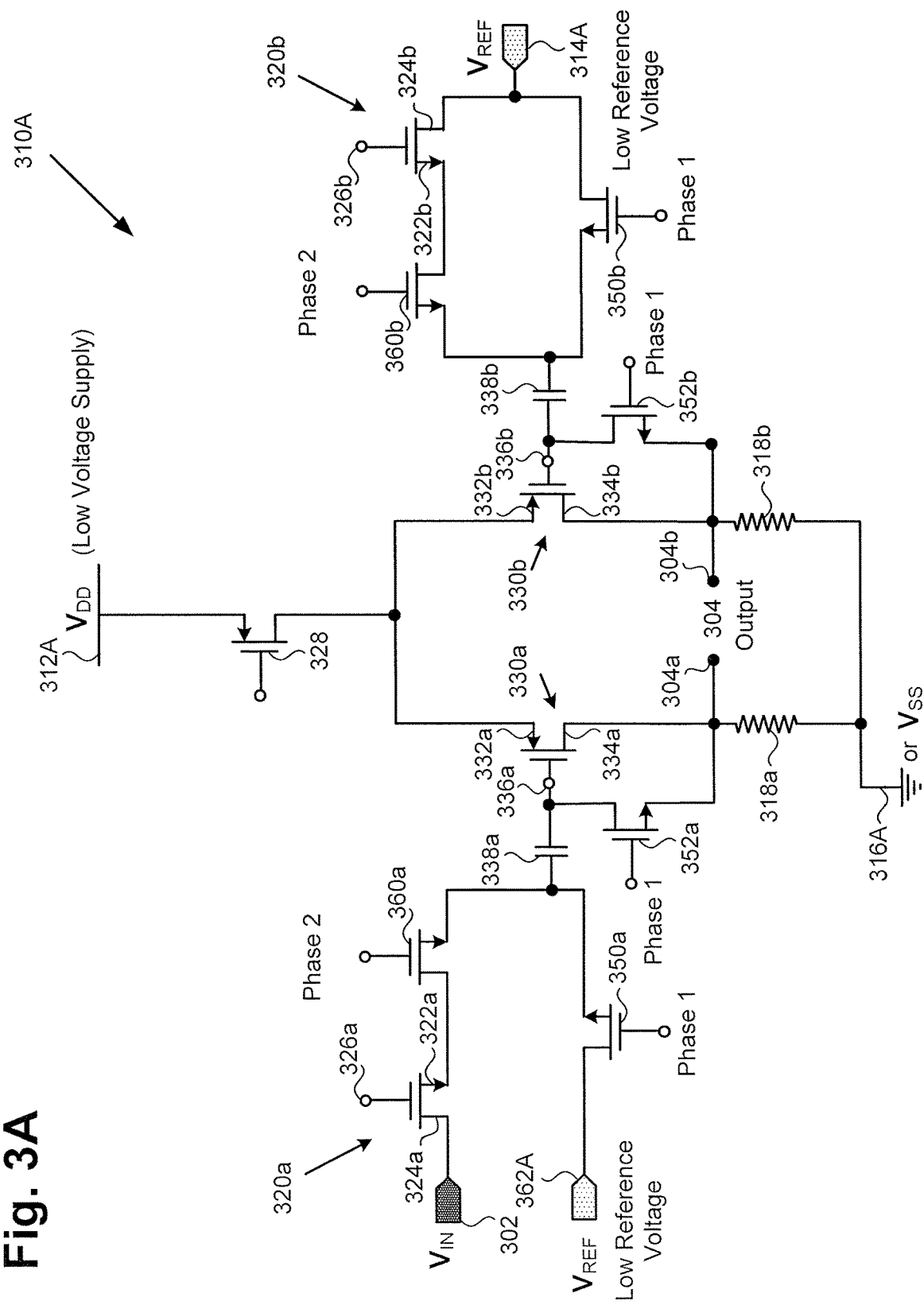
FIG. 3A shows a diagram of an exemplary voltage tolerant interface circuit suitable for use as part of the SoC of FIG. 1, according to another implementation.

FIG. 3A shows a diagram of exemplary voltage tolerant interface circuit 310A suitable for use as part of SoC 100 in FIG. 1, according to another implementation. As shown in FIG. 3A, exemplary voltage tolerant interface circuit 310A is implemented as an offset-calibrated differential comparator receiving input voltage $V_{IN}$ at input terminal 302 and generating output 304 at differential output terminals 304a and 304b based on the voltage $V_{IN}$ received at input terminal 302. Voltage tolerant interface circuit 310A having input terminal 302 and providing output 304 corresponds in general to voltage tolerant interface circuit 110 having input terminal 102 and providing output 104, in FIG. 1. Consequently, voltage tolerant interface circuits 110 and 310A may share any of the features attributed to either of voltage tolerant interface circuits 110 and 310A in the present disclosure.

It is noted that voltage tolerant interface circuit 310A shares many features in common with voltage tolerant interface circuit 210A, in FIG. 2A. It is further noted that any features identified in FIG. 2B by reference numbers corresponding to those used to identify features in FIG. 2A may share any of the characteristics attributed to those corresponding features above.

Thus first blocking transistor 320a, optional second blocking transistor 320b, and differential pair transistors 330a and 330b may share any of the characteristics attributed to respectively corresponding first blocking transistor 220a, optional second blocking transistor 220b, and differential pair transistors 230a and 230b, above. Moreover, supply rail transistor 328, load devices 318a and 318b, $V_{DD}$ 312A, $V_{REF}$ at reference voltage input 314A, and ground or $V_{SS}$ 316A may share any of the characteristics attributed to respectively corresponding supply rail transistor 228, load devices 218a and 218b, $V_{DD}$ 212A, $V_{REF}$ at reference voltage input 214A and ground or $V_{SS}$ 216A, above.

In addition to the features common to voltage tolerant interface circuit 210A, voltage tolerant interface circuit 310A includes Phase 1 reference voltage input terminal 362A, Phase 1 coupling transistors 350a and 350b, offset-calibration transistors 352a and 352b, offset-calibration capacitors 338a and 338b, and Phase 2 coupling transistors 360a and 360b. Phase 1 coupling transistors 350a and 350b, offset-calibration transistors 352a and 352b, and Phase 2 coupling transistors 360a and 360b may each be implemented as a low-voltage transistor having a voltage tolerance of up to approximately 1.0 V. Moreover, according to some implementations, offset-calibration capacitors 338a and 338b may each have a capacitance in a range from approximately 50 femto farads (50 fF) to approximately 200 fF.

It is noted that although voltage tolerant interface circuit 310A includes differential pair transistors 330a and 330b, supply rail transistor 328, first blocking transistor 320a, and optional second blocking transistor 320b in the form of FETs, that representation is merely exemplary. Furthermore, the representation in FIG. 3A of Phase 1 coupling transistors 350a and 350b, offset-calibration transistors 352a and 352b, and Phase 2 coupling transistors 360a and 360b as FETs is also merely exemplary. In other implementations, the transistors used to implement voltage tolerant interface circuit 310A may take the form of any switching devices suitable to the purposes of voltage tolerant interface circuit 310A and/or SoC 100.

According to the present exemplary implementation, each of differential pair transistors 330a and 330b, and supply rail transistor 328 is shown as a PFET. By contrast, each of first blocking transistor 320a, optional second blocking transistor 320b, Phase 1 coupling transistors 350a and 350b, offset-calibration transistors 352a and 352b, and Phase 2 coupling transistors 360a and 360b takes the form of an NFET. Thus, first blocking transistor 320a has source 322a, drain 324a, and gate 326a, while optional second blocking transistor 320b has source 322b, drain 324b, and gate 326b. Moreover, differential pair transistor 330a has source 332a, drain 334a, and gate 336a (hereinafter "control terminal 336a"), while differential pair transistor 330b has source 332b, drain 334b, and gate 336b (hereinafter "control terminal 336b").

First blocking transistor 320a is coupled between control terminal 336a of low-voltage differential pair transistor 330a and input terminal 302. According to the exemplary implementation shown in FIG. 3A, source 322a of NFET first blocking transistor 320a may be coupled to control terminal 336a of PFET differential pair transistor 330a by Phase 2 coupling transistor 360a and offset-calibration capacitor 338a. Moreover, drain 324a of first blocking transistor 320a may be directly coupled to input terminal 302.

In some implementations, optional second blocking transistor 320b may be coupled between control terminal 336b of low-voltage differential pair transistor 330b and reference voltage input 314A. For instance, according to the exemplary implementation shown in FIG. 3A, source 322b of NFET second blocking transistor 320b may be coupled to control terminal 336b of PFET differential pair transistor 330b by Phase 2 coupling transistor 360b and offset-calibration capacitor 338b. Moreover, drain 324b of second blocking transistor 320b may be directly coupled to reference voltage input 314A. However, in implementations in which optional second blocking transistor 320b is omitted, control terminal 336b of low-voltage differential pair transistor 330b may be coupled to reference voltage input 314A by Phase 2 coupling transistor 360b and offset-calibration capacitor 338b alone. It is noted that inclusion or omission of second blocking transistor 320b in voltage tolerant interface circuit 310A is a matter of design choice.

According to the exemplary implementation shown in FIG. 3A, voltage tolerant interface circuit 310A has two phases of operation. In Phase 1, Phase 1 coupling transistors 350a and 350b, and offset-calibration transistors 352a and 352b are turned on, while Phase 2 coupling transistors 360a and 360b are held off. During Phase 1, $V_{REF}$ is applied to control terminal 336a of low-voltage differential pair transistor 330a, as well as to control terminal 336b of low-voltage differential pair transistor 330b. In addition, control terminal 336a and drain 334a (input and output) of low-voltage differential pair transistor 330a are shorted together, and control terminal 336b and drain 334b (input and output) of low-voltage differential pair transistor 330b are shorted together, to bias voltage tolerant interface circuit 310A at its highest gain point.

Phase 1 operation of voltage tolerant interface circuit 310A causes the device mismatch, or offset, of low-voltage differential pair transistors 330a and 330b to be stored on offset-calibration capacitors 338a and 338b. Consequently, during Phase 2 operation, voltage tolerant interface circuit 310A advantageously performs as though low-voltage differential pair transistors 330a and 330b are matched.

In Phase 2, Phase 1 coupling transistors 350a and 350b, and offset-calibration transistors 352a and 352b are switched off, while Phase 2 coupling transistors 360a and 360b are switched on. During Phase 2, the operation of voltage tolerant interface circuit 310A is analogous to the operation of voltage tolerant interface circuit 210A described by reference to FIG. 2A. That is to say, voltage tolerant interface circuit 310A compares voltage $V_{IN}$ applied to a terminal, e.g., drain 324a, of first blocking transistor 320a to a reference voltage $V_{REF}$ applied to reference voltage input 314A.

It is noted that, due to offset-calibration capacitor 338a being interposed between control terminal 336a of low-voltage differential pair transistor 330a and input terminal 302, as well as between control terminal 336a and Phase 1 reference voltage input 362A, control terminal 336a is not exposed to a DC current. Similarly, due to offset-calibration capacitor 338b being interposed between control terminal 336b of low-voltage differential pair transistor 330b and reference voltage input 314A, control terminal 336b is also not exposed to a DC current.

First blocking transistor 320a and optional second blocking transistor 320b have their respective gates 326a and 326b biased at a voltage between $V_{REF}$ and the voltage tolerance of low-voltage differential pair transistors 330a and 330b. As a result of that biasing, first blocking transistor 320a and optional second blocking transistor 320b are always-on blocking transistors, i.e., during both Phase 1 operation and Phase 2 operation of voltage tolerant interface circuit 310A. As a specific example, where $V_{REF}$ applied to Phase 1 reference voltage input 362A and reference voltage input 314A is equal to 0.3 V, gates 326a and 326b of first and second blocking transistor 320a and 320b may be biased at 0.6 V.

Whether second blocking transistor 320b is included in voltage tolerant interface circuit 310A or not, during Phase 2 operation, $V_{REF}$ is passed by Phase 2 coupling transistor 360b and a voltage approximately equal to $V_{REF}$ corrected by the offset stored on offset-calibration capacitor 338b is applied to control terminal 336b of low-voltage differential pair transistor 330b. Moreover, because, according to the present implementation, low-voltage differential pair transistor 330b is a PFET and its gate-to-source voltage is negative, low-voltage differential pair transistor 330b is on, resulting in current flow through load device 318b and an output voltage at differential output terminal 304b.

First blocking transistor 320a is coupled between control terminal 236a of low-voltage differential pair transistor 330a and input terminal 302, and may have its gate 326a biased higher than $V_{REF}$. As noted above, and again as merely an example, where $V_{REF}$ is equal to 0.3 V, gate 326a of first blocking transistor 320a may be biased at 0.6 V. In that biased state, first blocking transistor 320a will block a portion of $V_{IN}$ when $V_{IN}$ is higher than the biasing voltage applied to gate 326a. In other words, a voltage at source 322a of first blocking transistor 320a will not exceed the biasing voltage applied to gate 326a. As a result, first blocking transistor 320a protects Phase 2 coupling transistor 360a and control terminal 336a of low-voltage differential pair transistor 330a by blocking the voltage received at input terminal 302 when $V_{IN}$ exceeds the voltage tolerance of low-voltage differential pair transistor 330a.

Thus, when $V_{IN}$ is higher than the bias voltage applied to gate 326a, the voltage at source 322a of first blocking transistor 320a and passed by Phase 2 coupling transistor 360a during Phase 2 operation is clamped at approximately the bias voltage, e.g., 0.6 V. Consequently, a voltage approximately equal to the bias voltage applied to gate 326a, corrected by the offset stored on offset-calibration capacitor 338a, is applied to control terminal 336a of low-voltage differential pair transistor 330a. According to the present implementation, because low-voltage differential pair transistor 330a is a PFET and its gate-to-source voltage is negative, low-voltage differential pair transistor 330a is also on, resulting in current flow through load device 318a and an output voltage at differential output terminal 304a.

However, the gate-to-source voltage of low-voltage differential pair transistor 330a is less negative than the gate-to-source voltage of low-voltage differential pair transistor 330b as long as $V_{IN}$ is greater than $V_{REF}$, resulting in a difference between the voltages present at respective differential output terminals 304a and 304b. For all values of $V_{IN}$ greater than $V_{REF}$, a differential voltage having a consistent polarity will be present at output 304. However, when $V_{IN}$ drops below $V_{REF}$, the polarity of the differential voltage at output 304 is reversed. Consequently, first blocking transistor 320a advantageously enables use of low-voltage differential transistors 330a and 330b to implement voltage tolerant interface circuit 310A as an offset-calibrated differential comparator, while also advantageously protecting low-voltage differential pair transistor 330a from voltages exceeding its voltage tolerance.

Figure 3B:
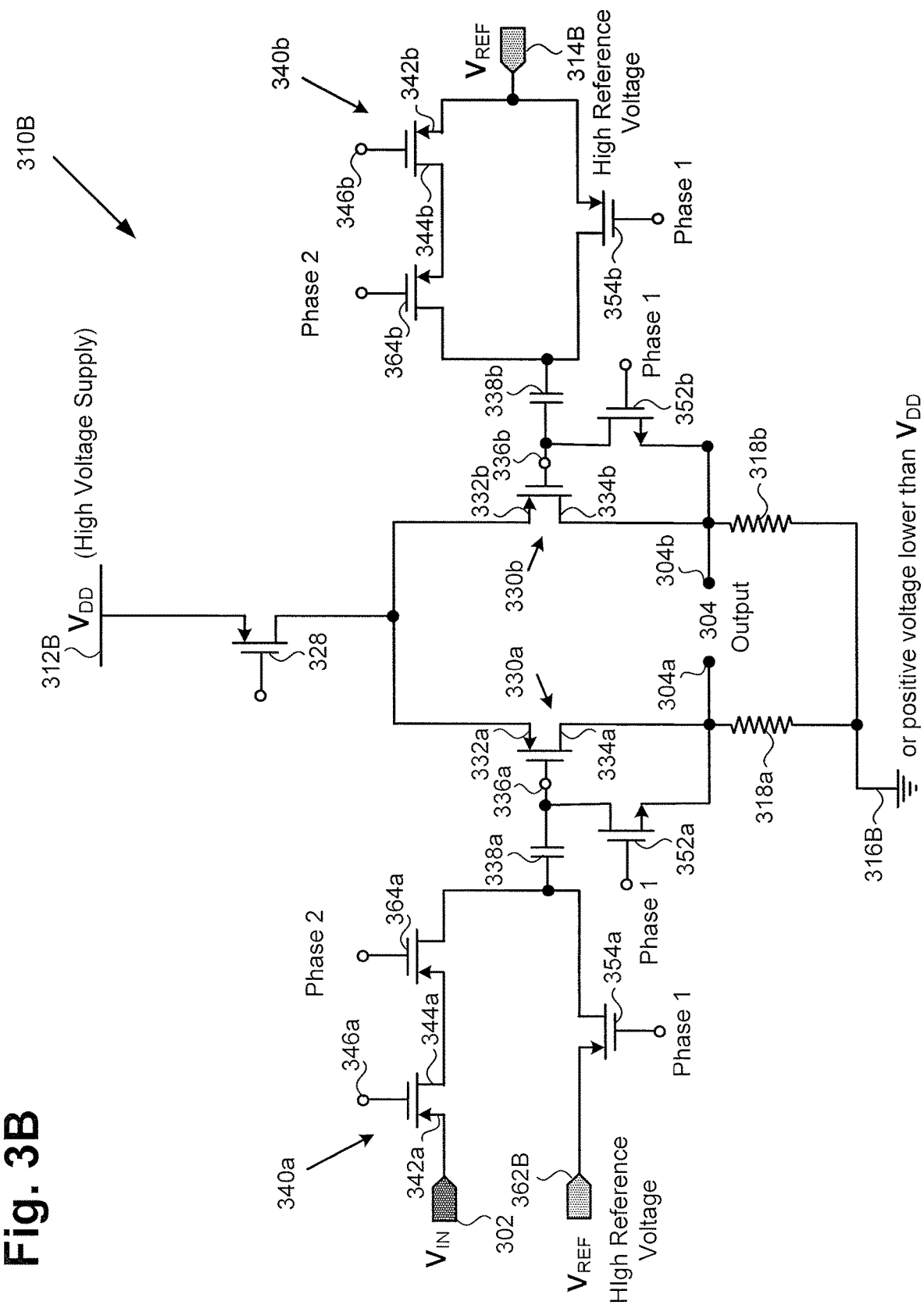
FIG. 3B shows another exemplary implementation of the voltage tolerant interface circuit of FIG. 3A.

Like voltage tolerant interface circuit 210A, voltage tolerant interface circuit 310A, in FIG. 3A, is configured to compare $V_{IN}$ to $V_{REF}$ when $V_{IN}$ is at the low end of its variable voltage range, i.e., between approximately 0.0 V and approximately 0.9 V. However, as noted above, in some applications it may be advantageous or desirable to utilize a voltage tolerant interface circuit including low-voltage transistors to sample compare $V_{IN}$ to $V_{REF}$ when $V_{IN}$ is higher, i.e., up to approximately 1.8 V. FIG. 3B shows one exemplary implementation of such a voltage tolerant interface circuit.

As shown in FIG. 3B, exemplary voltage tolerant interface circuit 310B is implemented as an offset-calibrated differential comparator receiving $V_{IN}$ at input terminal 302 and generating output 304 at differential output terminals 304a and 304b based on $V_{IN}$. Voltage tolerant interface circuit 310B having input terminal 302 and providing output 304 corresponds in general to voltage tolerant interface circuit 110 having input terminal 102 and providing output 104, in FIG. 1. Consequently, voltage tolerant interface circuits 110 and 310B may share any of the features attributed to either of voltage tolerant interface circuits 110 and 310B in the present disclosure.

It is noted that voltage tolerant interface circuit 310B shares many features in common with voltage tolerant interface circuit 310A, in FIG. 3A. It is further noted that any features identified in FIG. 3B by reference numbers identical to those used to identify corresponding features in FIG. 3A may share any of the characteristics attributed to those corresponding features above. Thus differential pair transistors 330a and 330b, supply rail transistor 328, and load devices 318a and 318b may have any of the characteristics described above by reference to FIG. 3A.

In addition to the features common to voltage tolerant interface circuit 310A, voltage tolerant interface circuit 310B includes Phase 1 coupling transistors 354a and 354b, Phase 2 coupling transistors 364a and 364b, first blocking transistor 340a, and optional second blocking transistor 340b in the form of PFET devices, in contrast to the NFET devices utilized for Phase 1 coupling transistors 350a and 350b, Phase 2 coupling transistors 360a and 360b, first blocking transistor 320a, and optional second blocking transistor 320b in FIG. 3A. In addition, voltage tolerant interface circuit 310B includes high voltage Phase 1 reference voltage input 362B, high reference voltage input 314B, high voltage supply $V_{DD}$ 312B and ground or low voltage 316B less than $V_{DD}$.

It is noted that although voltage tolerant interface circuit 310B includes Phase 1 coupling transistors 354a and 354b, Phase 2 coupling transistors 364a and 364b, first blocking transistor 340a, and optional second blocking transistor 340b in the form of FETs, that representation is merely exemplary. In other implementations, Phase 1 coupling transistors 354a and 354b, Phase 2 coupling transistors 364a and 364b, first blocking transistor 340a, and optional second blocking transistor 340b may take the form of any switching devices suitable to the purposes of voltage tolerant interface circuit 310B and/or SoC 100.

As stated above, differential pair transistors 330a and 330b, and supply rail transistor 328, may each be a low-voltage transistor having a voltage tolerance of up to approximately 1.0 V. As further stated above, input voltage $V_{IN}$ at input terminal 102/302 of voltage tolerant interface circuit 110/310A may vary between 0.0 V and 1.8 V. Moreover, according to the exemplary implementation shown in FIG. 3B, high voltage supply $V_{DD}$ 312B may be at 1.8 V. That is to say, in some implementations, low-voltage differential pair transistors 330a and 330b, and supply rail transistor 328, may receive supply voltage $V_{DD}$ 312B that is higher than the voltage tolerance of those low-voltage transistors. In addition, $V_{REF}$ applied to Phase 1 reference voltage input 362B and reference voltage input 314B may be in a range between 1.3 V and 1.8 V, such as 1.5 V for example, while load devices 318a and 318b may be considered to be coupled between respective differential output terminals 304a and 304b and low voltage 316B at approximately 0.9 V.

It is noted that although low-voltage differential pair transistors 330a and 330b, and low-voltage supply rail transistor 328, are exposed to supply voltage $V_{DD}$ 312B higher than their voltage tolerance, those devices can operate safely as long as the voltage across any two terminals remains within their voltage tolerance. By setting low voltage 316B so that the voltage difference between $V_{DD}$ 312B and low voltage 316B is within the voltage tolerance of those low-voltage devices, and by ensuring that low values of $V_{IN}$ are blocked by blocking transistor 340a, voltage tolerant interface circuit 310B can safely compare $V_{IN}$ between 0.9 V and 1.8 V with $V_{REF}$ in that range. It is further noted that when implemented as FETs, the body terminals of each the low-voltage transistors used in voltage tolerant interface circuit 310B may be tied to their respective sources.

Like voltage tolerant interface circuit 310A, voltage tolerant interface circuit 310B has two phases of operation. In Phase 1, Phase 1 coupling transistors 354a and 354b, and offset-calibration transistors 352a and 352b are turned on, while Phase 2 coupling transistors 364a and 364b are held off. During Phase 1, $V_{REF}$ is applied to control terminal 336a of low-voltage differential pair transistor 330a, as well as to control terminal 336b of low-voltage differential pair transistor 330b. In addition, control terminal 336a and drain 334a of low-voltage differential pair transistor 330a are shorted together, and control terminal 336b and drain 334b of low-voltage differential pair transistor 330b are shorted together, to bias voltage tolerant interface circuit 310B at its highest gain point.

Phase 1 operation of voltage tolerant interface circuit 310A causes the device mismatch, or offset, of low-voltage differential pair transistors 330a and 330b to be stored on offset-calibration capacitors 338a and 338b. Consequently, during Phase 2 operation, voltage tolerant interface circuit 310B advantageously performs as though low-voltage differential pair transistors 330a and 330b are matched.

In Phase 2, Phase 1 coupling transistors 354a and 354b, and offset-calibration transistors 352a and 352b are switched off, while Phase 2 coupling transistors 364a and 364b are switched on. During Phase 2, the operation of voltage tolerant interface circuit 310B is analogous to the operation of voltage tolerant interface circuit 210B described by reference to FIG. 2B. That is to say, voltage tolerant interface circuit 310B compares voltage $V_{IN}$ applied to a terminal, e.g., source 342a, of first blocking transistor 340a to a reference voltage $V_{REF}$ applied to reference voltage input 314B.

It is noted that, due to offset-calibration capacitor 338a being interposed between control terminal 336a of low-voltage differential pair transistor 330a and input terminal 302, as well as between control terminal 336a and Phase 1 reference voltage input 362B, control terminal 336a is not exposed to a DC current. Similarly, due to offset-calibration capacitor 338b being interposed between control terminal 336b of low-voltage differential pair transistor 330b and reference voltage input 314B, control terminal 336b is also not exposed to a DC current.

First blocking transistor 340a and optional second blocking transistor 340b have their respective gates 346a and 346b biased at a voltage below $V_{REF}$ and above the difference between high voltage supply $V_{DD}$ 312B and the voltage tolerance of the low-voltage transistors utilized in voltage tolerant interface circuit 310B. As a result of that biasing, first blocking transistor 340a and optional second blocking transistor 340b are always-on blocking transistors, i.e., during both Phase 1 operation and Phase 2 operation of voltage tolerant interface circuit 310B. As a specific example, where $V_{REF}$ applied to Phase 1 reference voltage input 362A and reference voltage input 314A is equal to 1.5 V, gates 346a and 346b of first and second blocking transistors 320a and 320b may be biased at 1.3 V.

Whether second blocking transistor 340b is included in voltage tolerant interface circuit 310B or not, during Phase 2 operation, $V_{REF}$ is passed by Phase 2 coupling transistor 364b and a voltage approximately equal to $V_{REF}$ corrected by the offset stored on offset-calibration capacitor 338b is applied to control terminal 336b of low-voltage differential pair transistor 330b. Moreover, because, according to the present implementation, low-voltage differential pair transistor 330b is a PFET and its gate-to-source voltage is negative, low-voltage differential pair transistor 330b is on, resulting in current flow through load device 318b and an output voltage at differential output terminal 304b.

First blocking transistor 340a is coupled between control terminal 336a of low-voltage differential pair transistor 330a and input terminal 302, and may have its gate 346a biased lower than $V_{REF}$. As noted above, and once again as merely an example, where $V_{REF}$ is equal to 1.5 V, gate 346a of first blocking transistor 340a may be biased at 1.3 V. In that biased state, first blocking transistor 340a will block $V_{IN}$ when $V_{IN}$ is lower than the biasing voltage applied to gate 346a, e.g., 1.3 V. In other words, a voltage at drain 344a of first blocking transistor 340a will not exceed the biasing voltage applied to gate 346a. As a result, first blocking transistor 340a protects Phase 2 coupling transistor 364a and control terminal 336a of low-voltage differential pair transistor 330a by blocking the voltage received at input terminal 302 when the difference between $V_{DD}$ 312B and $V_{IN}$ exceeds the voltage tolerance of low-voltage differential pair transistor 330a.

Thus, when $V_{IN}$ is lower than the bias voltage applied to gate 346a, the voltage at drain 344a of first blocking transistor 340a and passed by Phase 2 coupling transistor 364a during Phase 2 operation will be approximately equal to the bias voltage, e.g., 1.3 V. Consequently, a voltage approximately equal to the bias voltage applied to gate 346a, corrected by the offset stored on offset-calibration capacitor 338a, is applied to control terminal 336a of low-voltage differential pair transistor 330a. According to the present implementation, because low-voltage differential pair transistor 330a is a PFET and its gate-to-source voltage is negative, low-voltage differential pair transistor 330a is also on, resulting in current flow through load device 318a and an output voltage at differential output terminal 304a.

However, the gate-to-source voltage of low-voltage differential pair transistor 330a is more negative than the gate-to-source voltage of low-voltage differential pair transistor 330b as long as $V_{IN}$ is less than $V_{REF}$, resulting in a difference between the voltages present at respective differential output terminals 304a and 304b. For all values of $V_{IN}$ less than $V_{REF}$, a differential voltage having a consistent polarity will be present at output 304. However, when $V_{IN}$ exceeds $V_{REF}$, the polarity of the differential voltage at output 304 is reversed. Consequently, first blocking transistor 340a advantageously enables use of low-voltage differential transistors 330a and 330b to implement voltage tolerant interface circuit 310B as an offset-calibrated differential comparator, while also advantageously protecting low-voltage differential pair transistor 330a from voltages below a predetermined threshold voltage.

Figure 4A:
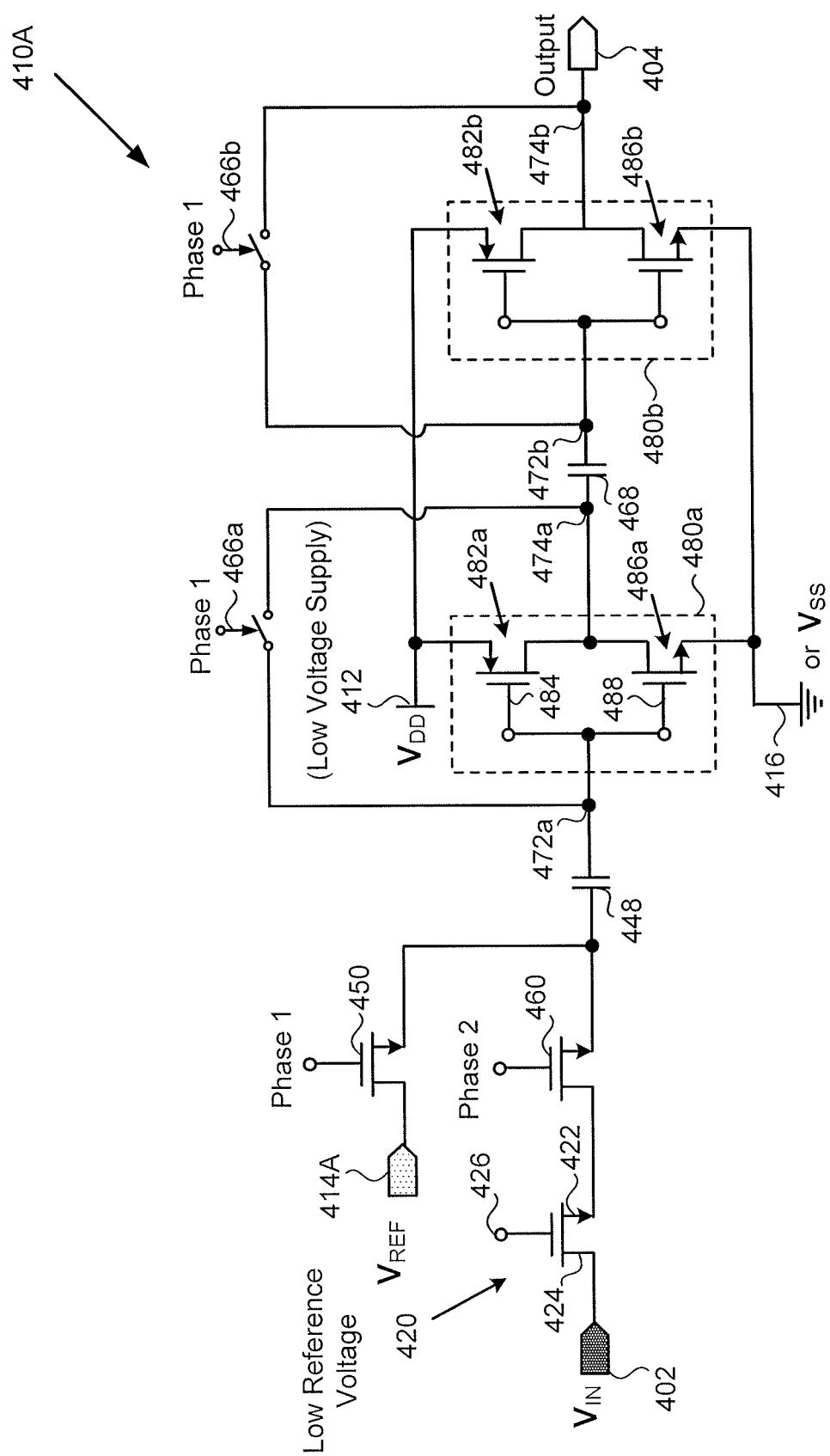
FIG. 4A shows a diagram of an exemplary voltage tolerant interface circuit suitable for use as part of the SoC of FIG. 1, according to another implementation.

FIG. 4A shows a diagram of exemplary voltage tolerant interface circuit 410A suitable for use as part of SoC 100 in FIG. 1, according to another implementation. As shown in FIG. 4A, exemplary voltage tolerant interface circuit 410A is implemented as an offset-calibrated single-ended comparator receiving input voltage $V_{IN}$ at input terminal 402 and generating output 404 based on the voltage $V_{IN}$ received at input terminal 402. Voltage tolerant interface circuit 410A having input terminal 402 and providing output 404 corresponds in general to voltage tolerant interface circuit 110 having input terminal 102 and providing output 104, in FIG. 1. Consequently, voltage tolerant interface circuits 110 and 410A may share any of the features attributed to either of voltage tolerant interface circuits 110 and 410A in the present disclosure.

Voltage tolerant interface circuit 410A includes inverters 480a and 480b, each coupled between low voltage supply $V_{DD}$ 412 and $V_{SS}$ or ground 416. Inverter 480a includes P type transistor 482a having control terminal 484a, and N type transistor 486a having control terminal 488a. Similarly, inverter 480b includes P type transistor 482b having control terminal 484b, and N type transistor 486b having control terminal 488b. In addition, voltage tolerant interface circuit 410A includes reference capacitor 448, offset-calibration capacitor 468, as well as N type Phase 1 coupling transistor 450, N type Phase 2 coupling transistor 460, and N type blocking transistor 420. Also shown in FIG. 4A are low reference voltage input 414A receiving $V_{REF}$, Phase 1 switches 466a and 466b, and nodes 472a, 474a, 472b, and 474b.

According to the implementation shown in FIG. 4A, each of inverters 480a and 480b, Phase 1 coupling transistor 450, and Phase two coupling transistor 460 may be a low-voltage transistor having a voltage tolerance of up to approximately 1.0 V. According to some implementations, reference capacitor 448 and offset-calibration capacitor 468 may each have a capacitance in a range from approximately 50 fF to approximately 200 fF. Moreover, and for merely exemplary purposes, low voltage supply $V_{DD}$ 412 may be at 0.9 V, $V_{REF}$ applied to reference voltage input 414A may be in a range between 0.0 V and 0.5 V, such as 0.3 V for example, and inverters 480a and 480b may be considered to be coupled between $V_{DD}$ 412 and ground 416.

It is noted that although voltage tolerant interface circuit 410A includes blocking transistor 420, Phase 1 coupling transistor 450, Phase two coupling transistor 460, and inverter transistors 482a, 486a, 482b, and 486b in the form of FETs, that representation is merely exemplary. In other implementations, blocking transistor 420, Phase 1 coupling transistor 450, Phase two coupling transistor 460, and inverter transistors 482a, 486a, 482b, and 486b may take the form of any switching devices suitable to the purposes of voltage tolerant interface circuit 410A and/or SoC 100.

According to the present exemplary implementation, inverter transistors 482a and 482b are shown as PFETs, while each of blocking transistor 420, Phase 1 coupling transistor 450, Phase two coupling transistor 460, and inverter transistors 486a and 486b takes the form of an NFET. Thus, blocking transistor 420 has source 422, drain 424, and gate 426. Moreover, inverter transistor 482a is shown to have gate 484 (hereinafter "control terminal 484"), while inverter transistor 486a is shown to have gate 488 (hereinafter "control terminal 488").

According to the exemplary implementation shown in FIG. 4A, voltage tolerant interface circuit 410A has two phases of operation. In Phase 1, Phase 1 coupling transistor 450 is turned on and Phase 1 switches 466a and 466b are closed, while Phase 2 coupling transistor 460 is held off. During Phase 1, $V_{REF}$ is applied to reference capacitor 448. In addition, closure of Phase 1 switches 466a and 466b ties the input of each of inverters 480a and 480b to its output. That is to say, the output of inverter 480a at node 474a is tied to the input of inverter 480a at node 472a, while the output of inverter 480b at node 474b is tied to the input of inverter 480b at node 472b.

Phase 1 operation of voltage tolerant interface circuit 410A causes the device mismatch, or offset, between inverters 480a and 480b to be stored on offset-calibration capacitor 468. Consequently, during Phase 2 operation, voltage tolerant interface circuit 410A advantageously performs as though inverters 480a and 480b are matched.

In Phase 2, Phase 1 coupling transistor 450 is switched off while Phase 1 switches 466a and 466b are opened, and Phase 2 coupling transistor 460 is switched on. During Phase 2, voltage tolerant interface circuit 410A compares voltage $V_{IN}$ applied to a terminal, e.g., drain 424, of blocking transistor 420 to a reference voltage $V_{REF}$ applied to reference voltage input 414A.

Blocking transistor 420 has its gate biased at a voltage between $V_{REF}$ and the voltage tolerance of the low-voltage transistors utilized in voltage tolerant interface circuit 410A. As a result of that biasing, blocking transistor 420 is an always-on blocking transistor, i.e., during both Phase 1 operation and Phase 2 operation of voltage tolerant interface circuit 410A. As a specific example, where $V_{REF}$ applied to reference voltage input 414A is equal to 0.3 V, gate 426 of blocking transistor 420 may be biased at 0.6 V.

Because blocking transistor 420 is always-on, its switching speed is not relevant to the overall performance of voltage tolerant interface circuit 410A. Consequently, blocking transistor 420 may be implemented using one or more small, fast, low-voltage transistors, or using one or more larger, slower, higher voltage tolerant transistors. In one implementation, blocking transistor 420 may take the form of a low-voltage transistor having a voltage tolerance substantially equal to the voltage tolerance of other low-voltage differential transistors utilized in voltage tolerant interface circuit 410A, i.e., a voltage tolerance of up to approximately 1.0 V.

Blocking transistor 420 is coupled between control terminals 484 and 488 of respective low-voltage inverter transistors 482a and 486a of inverter 480a (i.e., the input to inverter 480a) and input terminal 402, and may have its gate 426 biased higher than $V_{REF}$. As noted above, where $V_{REF}$ is equal to 0.3 V, gate 426 of blocking transistor 420 may be biased at 0.6 V. In that biased state, blocking transistor 420 will block a portion of $V_{IN}$ when $V_{IN}$ is higher than the biasing voltage applied to gate 426. In other words, a voltage at source 422 of blocking transistor 420 will not exceed the biasing voltage applied to gate 426. As a result, blocking transistor 420 protects Phase 2 coupling transistor 460 and control terminals 484 and 488 of respective low-voltage inverter transistors 482a and 486a by blocking the voltage received at input terminal 402 when $V_{IN}$ exceeds the voltage tolerance of low-voltage inverter transistors 482a and 486a.

It is noted that, due to reference capacitor 448 being interposed between control terminals 484 and 488 of respective low-voltage inverter transistors 482a and 486a of inverter 480a and input terminal 402, as well as between control terminals 484 and 488 and reference voltage input 414A, control terminals 484 and 488 are not exposed to a DC current.

When $V_{IN}$ is higher than the bias voltage applied to gate 426, blocking transistor 420 clamps the voltage applied to Phase 2 coupling transistor 460 and reference capacitor 448 at approximately the bias voltage, e.g., 0.6 V. When $V_{IN}$ is below the bias voltage applied to gate 426, blocking transistor 420 passes $V_{IN}$ to Phase 2 coupling transistor 460 and reference capacitor 448. As long as $V_{IN}$ is greater than $V_{REF}$, i.e., the input to voltage tolerant interface circuit 410A is high, the operation of inverters 480a and 480b results in output 404 being high. However, when $V_{IN}$ drops below $V_{REF}$, output 404 goes low. Consequently, blocking transistor 420 advantageously enables use of low-voltage transistors to implement voltage tolerant interface circuit 410A as an offset-calibrated single-ended comparator, while also advantageously protecting those low-voltage transistors from voltages exceeding their voltage tolerance.

Figure 4B:
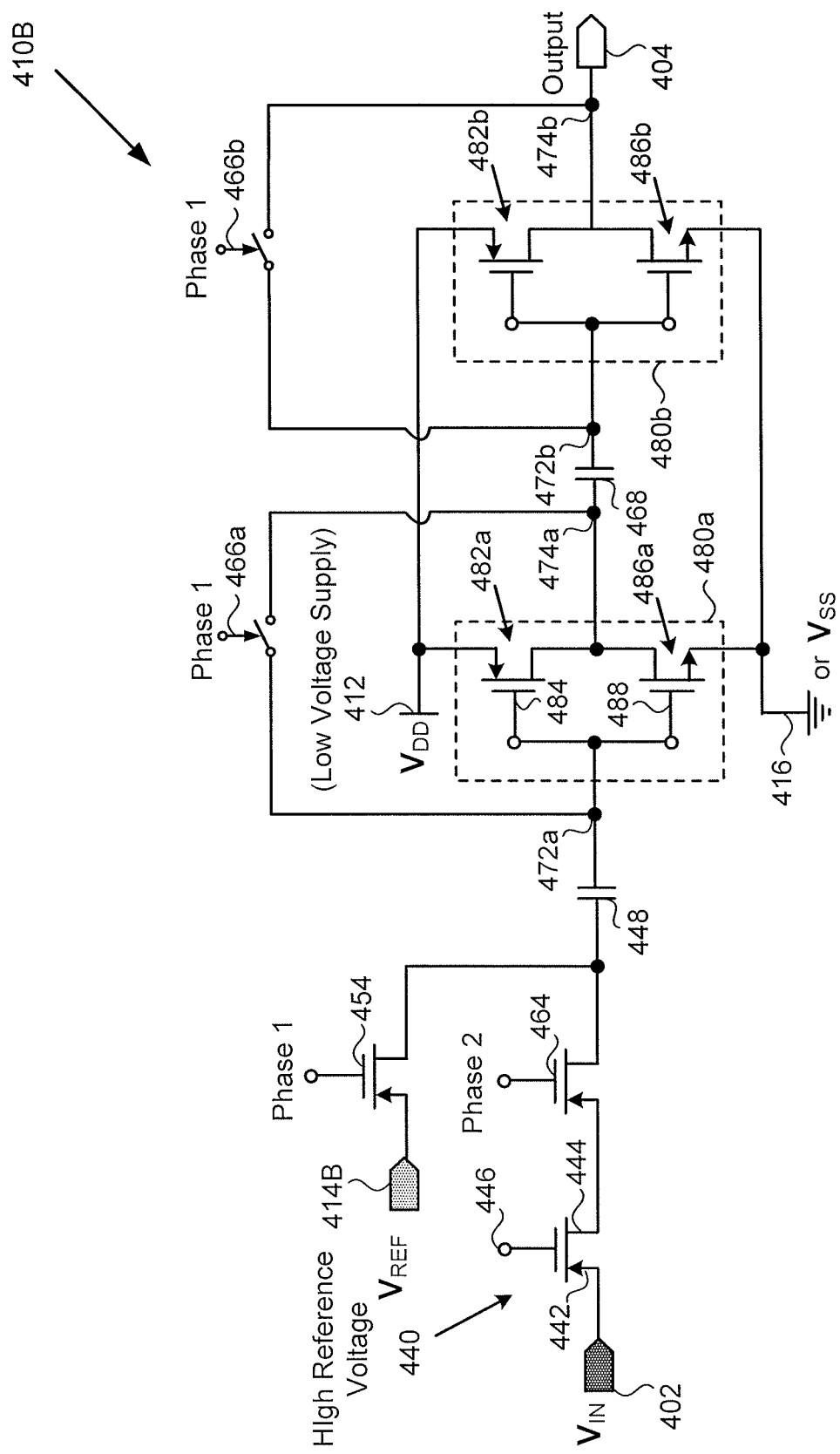
FIG. 4B shows another exemplary implementation of the voltage tolerant interface circuit of FIG. 4A.

FIG. 4B shows another exemplary implementation of the voltage tolerant interface circuit of FIG. 4A. Like voltage tolerant interface circuit 410A, exemplary voltage tolerant interface circuit 410B is implemented as an offset-calibrated single-ended comparator receiving $V_{IN}$ at input terminal 402 and generating output 404 based on $V_{IN}$. Voltage tolerant interface circuit 410B having input terminal 402 and providing output 404 corresponds in general to voltage tolerant interface circuit 110 having input terminal 102 and providing output 104, in FIG. 1. Consequently, voltage tolerant interface circuits 110 and 410B may share any of the features attributed to either of voltage tolerant interface circuits 110 and 410B in the present disclosure.

It is noted that voltage tolerant interface circuit 410B shares many features in common with voltage tolerant interface circuit 410A, in FIG. 4A. It is further noted that any features identified in FIG. 4B by reference numbers identical to those used to identify corresponding features in FIG. 4A may share any of the characteristics attributed to those corresponding features above. Thus inverters 480a and 480b, Phase 1 switches 466a and 466b, reference capacitor 448, and offset-calibration capacitor 468 may have any of the characteristics described above by reference to FIG. 4A.

Voltage tolerant interface circuit 410B differs from the implementation shown in FIG. 4A in that Phase 1 coupling transistor 454, Phase 2 coupling transistor 464, and blocking transistor 440 are PFET devices, in contrast to the NFET devices utilized for Phase 1 coupling transistor 450, Phase 2 coupling transistor 460, and blocking transistor 420 in FIG. 4A. In addition, voltage tolerant interface circuit 410B includes high reference voltage input 414B.

It is noted that although voltage tolerant interface circuit 410B includes Phase 1 coupling transistor 454, Phase 2 coupling transistor 464, and blocking transistor 440 in the form of FETs, that representation is merely exemplary. In other implementations, Phase 1 coupling transistor 454, Phase 2 coupling transistor 464, and blocking transistor 440 may take the form of any switching devices suitable to the purposes of voltage tolerant interface circuit 410B and/or SoC 100.

It is further noted that Phase 1 coupling transistor 454, Phase 2 coupling transistor 464, and blocking transistor 440 correspond respectively to Phase 1 coupling transistors 254a/254b, Phase 2 coupling transistor 264a/264b, and blocking transistor 240a/240b, in FIG. 2B. Consequently, Phase 1 coupling transistor 454, Phase 2 coupling transistor 464, and blocking transistor 440 may share any of the characteristics attributed to respectively corresponding Phase 1 coupling transistors 254a/254b, Phase 2 coupling transistor 264a/264b, and blocking transistor 240a/240b in the present disclosure.

In operation, voltage tolerant interface circuit 410B functions analogously to voltage tolerant interface circuit 410A, but compares $V_{IN}$ to $V_{REF}$ when $V_{IN}$ is at the high end of its variable voltage range, i.e., up to approximately 1.8 V. In view of the discussion above comparing operation of the circuit implementations in FIGS. 2A with 2B, and 3A with 3B, and in further view of the description of voltage tolerant interface circuit 410A above, the operation of voltage tolerant interface circuit 410B will not be described in detail. However, it is noted that blocking transistor 440 has its gate biased at a voltage below $V_{REF}$, which may be in a range from approximately 1.3 V to approximately 1.8V. As a result of that biasing, blocking transistor 440 is an always-on blocking transistor, i.e., during both Phase 1 operation and Phase 2 operation of voltage tolerant interface circuit 410B. As a specific example, where $V_{REF}$ applied to reference voltage input 414B is equal to 1.5 V, gate 446 of blocking transistor 440 may be biased at 1.3 V.

Blocking transistor 440 is coupled between control terminals 484 and 488 of respective low-voltage inverter transistors 482a and 486a of inverter 480a (i.e., the input to inverter 480a) and input terminal 402. The biasing of blocking transistor 440 will block $V_{IN}$ when $V_{IN}$ is lower than the biasing voltage applied to gate 446. In other words, a voltage at drain 444 of blocking transistor 440 will not fall below the biasing voltage applied to gate 446. As a result, blocking transistor 440 protects Phase 2 coupling transistor 464 and control terminals 484 and 488 of respective low-voltage inverter transistors 482a and 486a by blocking the voltage received at input terminal 402 when $V_{IN}$ is below a predetermined voltage threshold.

Figure 5:
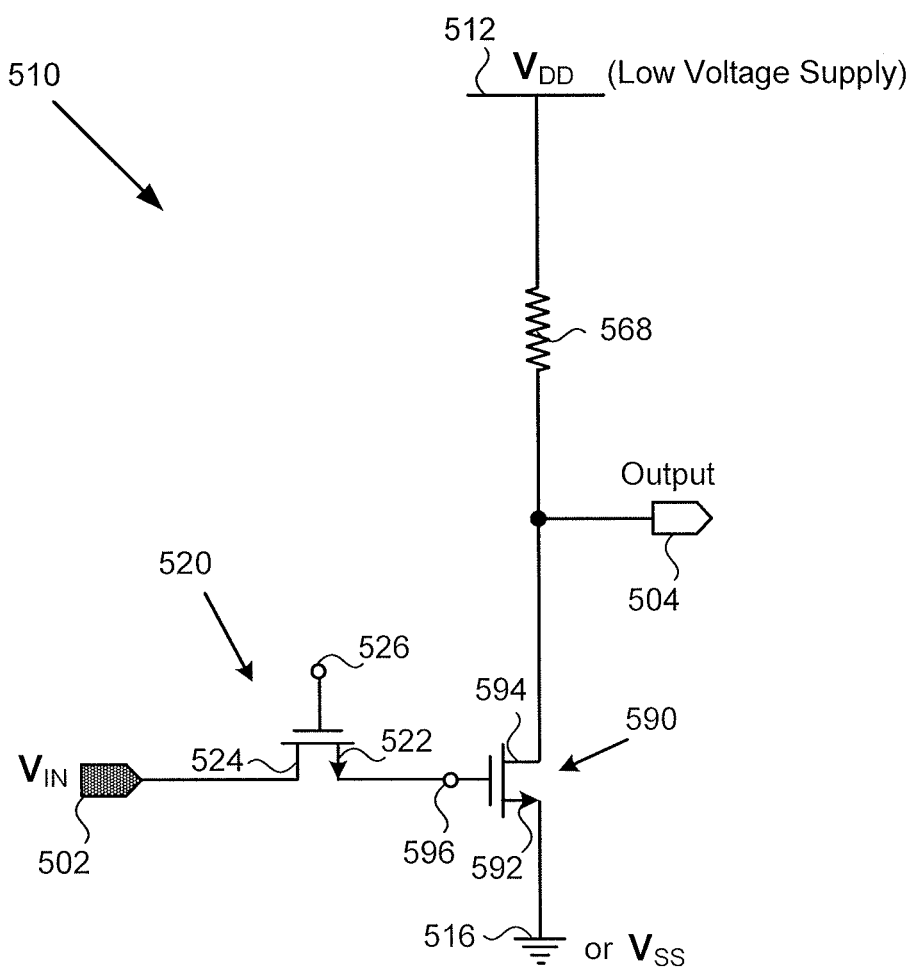
FIG. 5 shows a diagram of an exemplary voltage tolerant interface circuit suitable for use as part of the SoC of FIG. 1, according to yet another implementation.

FIG. 5 shows a diagram of exemplary voltage tolerant interface circuit 510 suitable for use as part of SoC 100 in FIG. 1, according to yet another implementation. As shown in FIG. 5, exemplary voltage tolerant interface circuit 510 is implemented as a level converter receiving input voltage $V_{IN}$ at input terminal 502 and generating output 504 based on the voltage $V_{IN}$ received at input terminal 502.

Voltage tolerant interface circuit 510 having input terminal 502 and providing output 504 corresponds in general to voltage tolerant interface circuit 110 having input terminal 102 and providing output 104, in FIG. 1. Consequently, voltage tolerant interface circuits 110 and 510 may share any of the features attributed to either of voltage tolerant interface circuits 110 and 510 in the present disclosure. Moreover, blocking transistor 520 corresponds to blocking transistors 220a and 220b, in FIGS. 2A and 2C, as well as to blocking transistor 420, in FIG. 4A. Thus, blocking transistor 520 may share any of the characteristics attributed to blocking transistors 220a, 220b, and 420 in the present disclosure.

According to the exemplary implementation shown in FIG. 5, blocking transistor 520 and low-voltage transistor 590 are implemented as N type transistors. Also shown in FIG. 5 are low voltage supply $V_{DD}$ 512, $V_{SS}$ or ground 516, and resistor 568 coupled between $V_{DD}$ 512 and low-voltage transistor 590. According to the present implementation, low-voltage transistor 590 is a transistor having a voltage tolerance of up to approximately 1.0 V. Moreover, and for merely exemplary purposes, low voltage supply $V_{DD}$ 512 may be at 0.9 V and low-voltage transistor 590 may be considered to be coupled to ground at 516.

It is noted that although voltage tolerant interface circuit 510 includes blocking transistor 520 and low-voltage transistor 590 in the form of FETs, that representation is merely exemplary. In other implementations, blocking transistor 520 and low-voltage transistor 590 may take the form of any switching devices suitable to the purposes of voltage tolerant interface circuit 510 and/or SoC 100. Nevertheless, according to the present exemplary implementation, each of blocking transistor 520 and low-voltage transistor 590 takes the form of an NFET. Thus, blocking transistor 520 has source 522, drain 524, and gate 526, while low-voltage transistor 590 is shown to have source 592, drain 594, and gate 596 (hereinafter "control terminal 596").

Blocking transistor 520 has gate 526 biased at a voltage within the voltage tolerance of low-voltage transistor 590, e.g., up to approximately 0.9 V. As a result of that biasing, blocking transistor 520 is an always-on blocking transistor. Because blocking transistor 520 is always-on, its switching speed is not relevant to the overall performance of voltage tolerant interface circuit 510. Consequently, blocking transistor 520 may be implemented using one or more small, fast, low-voltage transistors, or using one or more larger, slower, higher voltage tolerant transistors. In one implementation, blocking transistor 520 may take the form of a low-voltage transistor having a voltage tolerance substantially equal to the voltage tolerance of low-voltage transistor 590, i.e., a voltage tolerance of up to approximately 1.0 V.

Blocking transistor 520 is coupled between control terminal 596 of low-voltage transistor 590 and input terminal 502. Because it is biased, blocking transistor 520 will block a portion of $V_{IN}$ when $V_{IN}$ is higher than the biasing voltage applied to gate 526. In other words, a voltage at source 522 of blocking transistor 520 will not exceed the biasing voltage applied to gate 526. As a result, blocking transistor 520 protects control terminal 596 of low-voltage transistor 590 by blocking the voltage received at input terminal 502 when $V_{IN}$ exceeds the voltage tolerance of low-voltage transistor 590.

When $V_{IN}$ is higher than the bias voltage applied to gate 526, blocking transistor 520 clamps the voltage applied to control terminal 596 of low-voltage transistor 590 at approximately that bias voltage. When $V_{IN}$ is below the bias voltage applied to gate 526, blocking transistor 520 passes $V_{IN}$ to control terminal 596 of low-voltage transistor 590. As long as $V_{IN}$ is greater than a turn-on voltage of low-voltage transistor 590, i.e., the input to voltage tolerant interface circuit 510 is high, output 504 is pulled to ground 512 and is low. However, when $V_{IN}$ drops below the turn-on voltage of low-voltage transistor 590, i.e., the input to voltage tolerant interface circuit 510 is low, output 504 goes high. Consequently, blocking transistor 520 advantageously enables use of low-voltage transistor 590 to implement voltage tolerant interface circuit 510 as an inverter, while also advantageously protecting low-voltage transistor 590 from voltages exceeding its voltage tolerance.

Thus, the present application discloses voltage tolerant interface circuits enabling use of low-voltage transistors in applications in which voltages exceeding the voltage tolerance of those transistors may be present. By interposing a blocking transistor between a control terminal of a low-voltage transistor and an input terminal to the voltage tolerant interface circuit, the present inventive principles provide voltage protection for the low-voltage transistor. In some implementations, the blocking transistor protects the control terminal of the low-voltage transistor by blocking the voltage received at the input terminal when the voltage exceeds a voltage tolerance of the low-voltage transistor. In other implementations, the low-voltage transistor receives a supply voltage higher than its voltage tolerance. In that implementation, the blocking transistor protects the control terminal of the low-voltage transistor by blocking the voltage received at the input terminal when the voltage is below a predetermined threshold voltage.

From the above description it is manifest that various techniques can be used s for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A voltage tolerant interface circuit comprising:
an input terminal;
at least one low-voltage transistor for generating an output from the voltage tolerant interface circuit based on a voltage received at the input terminal;
a blocking transistor coupled between a control terminal of the at least one low-voltage transistor and the input terminal;
wherein the blocking transistor is configured to protect the control terminal of the at least one low-voltage transistor by blocking the voltage received at the input terminal when the voltage exceeds a voltage tolerance of the at least one low-voltage transistor.

2. The voltage tolerant interface circuit of claim 1, wherein the voltage tolerant interface circuit is configured to compare a voltage applied to a terminal of the blocking transistor to a reference voltage applied to a reference voltage input.

3. The voltage tolerant interface circuit of claim 1, wherein the blocking transistor is an always-on blocking transistor.

4. The voltage tolerant interface circuit of claim 1, wherein the voltage tolerance of the at least one low-voltage transistor is up to one volt.

5. The voltage tolerant interface circuit of claim 1, wherein a voltage tolerance of the blocking transistor is substantially equal to the voltage tolerance of the at least one low-voltage transistor.

6. The voltage tolerant interface circuit of claim 1, wherein the voltage tolerant interface circuit is included with an integrated voltage regulator as part of a system-on-chip (SoC).

7. A voltage tolerant interface circuit comprising:
an input terminal;
at least one low-voltage transistor for generating an output from the voltage tolerant interface circuit based on a voltage received at the input terminal, the at least one low-voltage transistor receiving a supply voltage higher than a voltage tolerance of the at least one low-voltage transistor;
a blocking transistor coupled between a control terminal of the at least one low-voltage transistor and the input terminal;
wherein the blocking transistor is configured to protect the control terminal of the at least one low-voltage transistor by blocking the voltage received at the input terminal when the voltage is below a predetermined threshold voltage.

8. The voltage tolerant interface circuit of claim 7, wherein the voltage tolerant interface circuit is configured to compare a voltage applied to a terminal of the blocking transistor to a reference voltage applied to a reference voltage input.

9. The voltage tolerant interface circuit of claim 7, wherein the blocking transistor is an always-on blocking transistor.

10. The voltage tolerant interface circuit of claim 7, wherein the voltage tolerance of the at least one low-voltage transistor is up to one volt.

11. The voltage tolerant interface circuit of claim 7, wherein a voltage tolerance of the blocking transistor is substantially equal to the voltage tolerance of the at least one low-voltage transistor.

12. The voltage tolerant interface circuit of claim 7, wherein the voltage tolerant interface circuit is included with an integrated voltage regulator as part of a system-on-chip (SoC).

13. A voltage tolerant interface circuit comprising:
an input terminal;
at least one low-voltage transistor for generating an output from the voltage tolerant interface circuit based on a voltage received at the input terminal, the at least one low-voltage transistor receiving a supply voltage higher than a voltage tolerance of the at least one low-voltage transistor;

a blocking transistor coupled between a control terminal of the at least one low-voltage transistor and the input terminal;

wherein the blocking transistor is configured to protect the control terminal of the at least one low-voltage transistor by blocking the voltage received at the input terminal.

14. The voltage tolerant interface circuit of claim 13, wherein the voltage tolerant interface circuit is configured to compare a voltage applied to a terminal of the blocking transistor to a reference voltage applied to a reference voltage input.

15. The voltage tolerant interface circuit of claim 13, wherein the blocking transistor is an always-on blocking transistor.

16. The voltage tolerant interface circuit of claim 13, wherein the voltage tolerance of the at least one low-voltage transistor is up to one volt.

17. The voltage tolerant interface circuit of claim 13, wherein a voltage tolerance of the blocking transistor is substantially equal to the voltage tolerance of the at least one low-voltage transistor.

18. The voltage tolerant interface circuit of claim 13, wherein the voltage tolerant interface circuit is included with an integrated voltage regulator as part of a system-on-chip (SoC).

* * * * *